United States Patent
Suzuki et al.

(10) Patent No.: US 12,138,710 B2
(45) Date of Patent: Nov. 12, 2024

(54) LASER PROCESSING APPARATUS AND METHOD OF MANUFACTURING SEMICONDUCTOR DEVICE

(71) Applicant: JSW AKTINA SYSTEM CO., LTD., Yokohama (JP)

(72) Inventors: Yuki Suzuki, Yokohama (JP); Yoshihiro Yamaguchi, Yokohama (JP); Takahiro Fuji, Yokohama (JP); Takahiro Mikami, Yokohama (JP)

(73) Assignee: JSW AKTINA SYSTEM CO., LTD, Yokohama (JP)

( * ) Notice: Subject to any disclaimer, the term of this patent is extended or adjusted under 35 U.S.C. 154(b) by 1002 days.

(21) Appl. No.: 16/975,117

(22) PCT Filed: Mar. 25, 2019

(86) PCT No.: PCT/JP2019/012598
§ 371 (c)(1),
(2) Date: Aug. 22, 2020

(87) PCT Pub. No.: WO2019/202923
PCT Pub. Date: Oct. 24, 2019

(65) Prior Publication Data
US 2021/0362273 A1    Nov. 25, 2021

(30) Foreign Application Priority Data

Apr. 19, 2018 (JP) ................................ 2018-080321

(51) Int. Cl.
*B23K 26/352* (2014.01)
*B23K 101/40* (2006.01)
(Continued)

(52) U.S. Cl.
CPC .......... *B23K 26/352* (2015.10); *H01L 21/268* (2013.01); *B23K 2101/40* (2018.08); *H01L 27/1274* (2013.01)

(58) Field of Classification Search
CPC . B23K 26/352; B23K 2101/40; H01L 21/268; H01L 27/1274; H01L 27/1285;
(Continued)

(56) References Cited

U.S. PATENT DOCUMENTS

2007/0017442 A1*  1/2007  Yamasaki ........... H01L 21/6776
                                                        118/695
2008/0276864 A1* 11/2008  Koelmel ........... H01L 21/67115
                                                        118/500
(Continued)

FOREIGN PATENT DOCUMENTS

CN       103262213 A      8/2013
CN       107430998 A     12/2017
(Continued)

OTHER PUBLICATIONS

International Search Report from International Patent Application No. PCT/JP2019/012598, May 28, 2019.
(Continued)

*Primary Examiner* — Brian W Jennison
*Assistant Examiner* — Kristina J Babinski
(74) *Attorney, Agent, or Firm* — Potomac Law Group, PLLC

(57) ABSTRACT

A laser processing apparatus according to an embodiment includes a laser light irradiation unit and a conveying stage capable of allowing a substrate to float and convey. The conveying stage includes: a laser light irradiation region; and a substrate conveying region separated from the laser light irradiation region, a surface of the laser light irradiation region facing the substrate is configured by a first member
(Continued)

from which a first gas is capable of jetting out to float the substrate, a surface of the substrate conveying region facing the substrate is configured by a plurality of second members from which a second gas is capable of jetting out to float the substrate, and the plurality of second members in the substrate conveying region are disposed to be separated from each other.

18 Claims, 23 Drawing Sheets

(51) Int. Cl.
  *H01L 21/268* (2006.01)
  *H01L 27/12* (2006.01)
(58) Field of Classification Search
  CPC ........... H01L 21/67115; H01L 21/6776; H01L 21/67784
  See application file for complete search history.

(56) References Cited

U.S. PATENT DOCUMENTS

| | | | |
|---|---|---|---|
| 2009/0311434 A1 | 12/2009 | Inamasu et al. | |
| 2012/0266819 A1* | 10/2012 | Sanchez | H01L 21/67115 |
| | | | 118/729 |
| 2013/0273749 A1 | 10/2013 | Mizumura et al. | |
| 2018/0014411 A1* | 1/2018 | Vronsky | H05K 3/4644 |
| 2018/0033664 A1 | 2/2018 | Fuji et al. | |
| 2018/0040718 A1 | 2/2018 | Mizumura | |
| 2019/0193200 A1 | 6/2019 | Fuji et al. | |

FOREIGN PATENT DOCUMENTS

| | | | |
|---|---|---|---|
| CN | 107615451 A | | 1/2018 |
| JP | 2002231654 | * | 8/2002 |
| JP | 2007-027495 A | | 2/2007 |
| JP | 2007027495 | * | 2/2007 |
| JP | 2016-162856 A | | 9/2016 |
| JP | 2016162856 | * | 9/2016 |
| JP | 2018-037431 A | | 3/2018 |
| JP | 2018-060891 A | | 4/2018 |
| KR | 20140087116 | * | 7/2014 |
| WO | WO 2008/013035 A1 | | 1/2008 |
| WO | WO 2015/174347 A1 | | 11/2015 |
| WO | WO 2019/038953 A1 | | 2/2019 |

OTHER PUBLICATIONS

Office Action issued Mar. 4, 2024, in Chinese Patent Application No. 201980016879.X.

* cited by examiner

LASER PROCESSING APPARATUS AND METHOD OF MANUFACTURING SEMICONDUCTOR DEVICE

TECHNICAL FIELD

The present invention relates to a laser processing apparatus and a method of manufacturing a semiconductor device, and, for example, to a laser processing apparatus and a method of manufacturing a semiconductor in which a semiconductor device is manufactured by irradiation with laser light.

BACKGROUND ART

In a manufacturing process of high-definition panels such as smartphones and televisions, it is known to perform heat treatment by laser light irradiation in order to form TFTs (thin film transistors) that control pixels of a panel. Patent Literatures 1 and 2 disclose laser processing apparatuses that irradiate a workpiece including an amorphous film formed on a glass substrate with laser light to perform an annealing process. In the laser processing apparatuses disclosed in Patent Literatures 1 and 2, the annealing process is performed over a floating stage in which the workpiece floats by jet air.

CITATION LIST

Patent Literature

Patent Literature 1: International Patent Publication No. WO 2015/174347
Patent Literature 2: Japanese Unexamined Patent Application Publication No. 2016-162856

SUMMARY OF INVENTION

Technical Problem

There is room for improvement on the laser processing apparatus for performance improvement of laser processing. For example, the performance of the laser processing deteriorates due to troubles that occur at the time of conveying a substrate to be subjected to laser processing.

Other problems and novel features will be apparent from the description of the specification and accompanying drawings.

Solution to Problem

A laser processing apparatus according to an embodiment includes a laser light irradiation unit and a conveying stage capable of allowing a substrate to float and convey. The conveying stage includes: a laser light irradiation region in which the substrate is irradiated with laser light irradiated from the laser light irradiation unit; and a substrate conveying region separated from the laser light irradiation region, a surface of the laser light irradiation region facing the substrate is configured by a first member from which a first gas is capable of jetting out to float the substrate, a surface of the substrate conveying region facing the substrate is configured by a plurality of second members from which a second gas is capable of jetting out to float the substrate, and the plurality of second members in the substrate conveying region are disposed to be separated from each other.

Advantageous Effects of Invention

According to the embodiment described above, it is possible to provide a laser processing apparatus and a method of manufacturing a semiconductor device capable of improving performance of laser processing.

DESCRIPTION OF EMBODIMENTS

Figure 1:
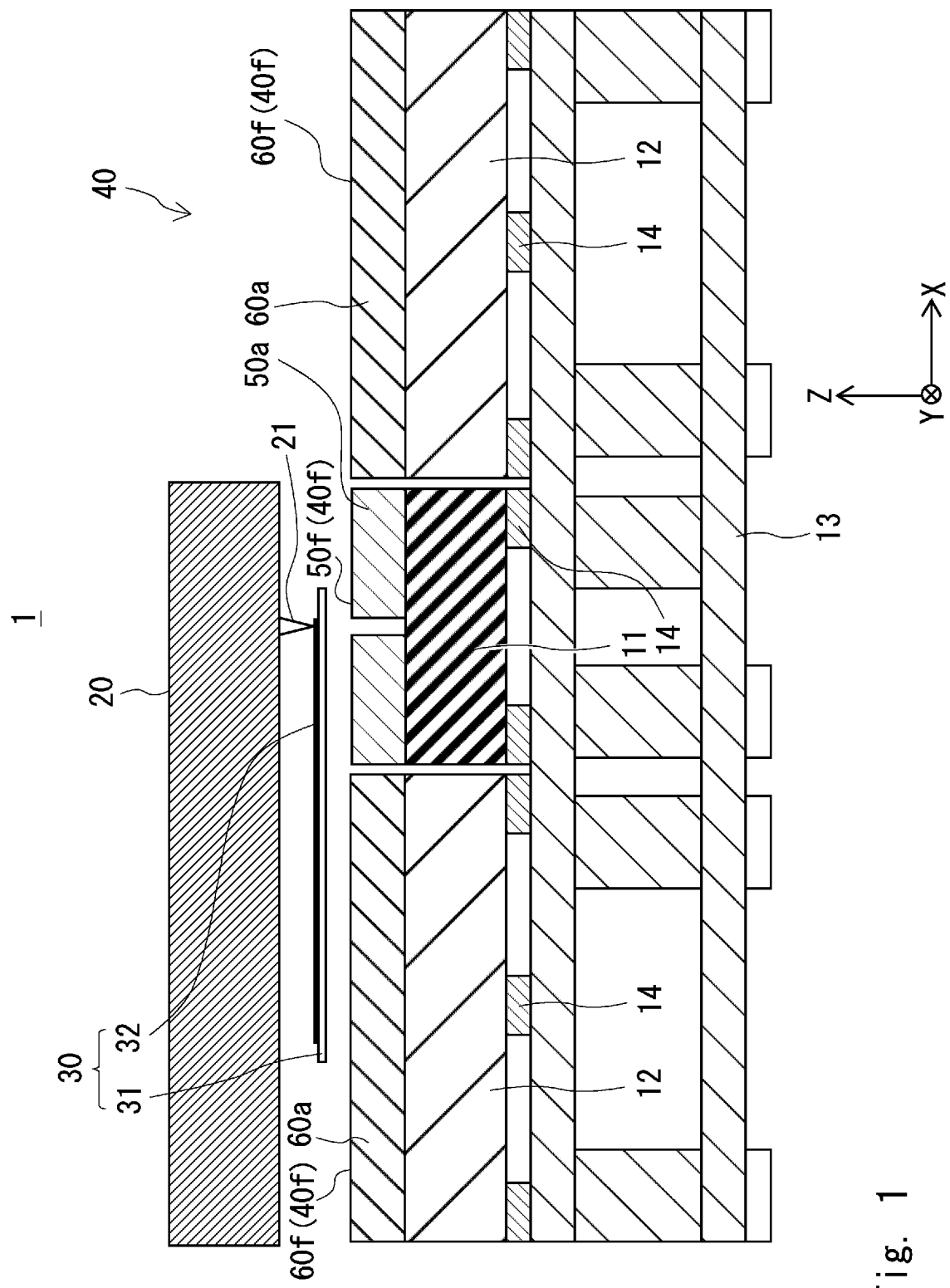
FIG. 1 is a cross-sectional view exemplifying a laser processing apparatus according to a first embodiment.

For clarity of explanation, the following description and the drawings are not presented and simplified as appropriate. Further, throughout the drawings, the same elements are denoted by the same reference numerals, and are not repeatedly described as necessary.

First, problems of a laser processing apparatus will be described using a laser processing apparatus according to a comparative example. Then, laser processing apparatuses according to embodiments will be described in comparison with the comparative example. Thus, the laser processing apparatuses according to the embodiments are more cleared.

Comparative Example

Figure 23:
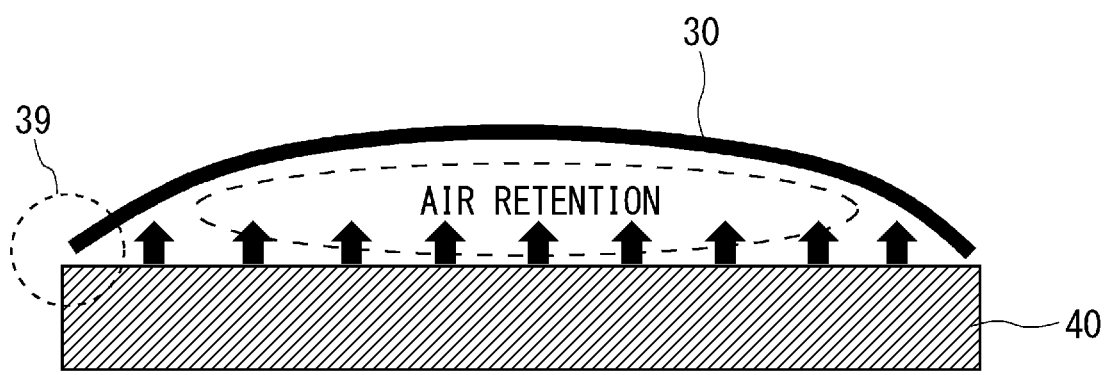
FIG. 23 is a cross-sectional view exemplifying a state in which a workpiece is disposed over a conveying stage of a laser processing apparatus according to a comparative example.

First, a laser processing apparatus according to a comparative example will be described. FIG. 23 is a cross-sectional view exemplifying a state in which a workpiece 30 is disposed over a conveying stage 40 of a laser processing apparatus 101 according to the comparative example. As shown in FIG. 23, when the workpiece 30 is conveyed in a state of being floated over the conveying stage 40, a jet air is retained between a central portion of the workpiece 30 and the conveying stage 40, and the workpiece 30 may be dome-shaped. Then, as the central portion of the workpiece 30 excessively floats and bends, edge portions 39 and corner portions of the workpiece 30 hang down. Then, the edge portions 39 and the corner portions of the workpiece 30 come into contact with the conveying stage 40 and are damaged. As a result, due to the influence of dust or the like generated from the damaged portion, uneven irradiation with laser light occurs, and performance of laser processing deteriorates.

First Embodiment

Figure 2:
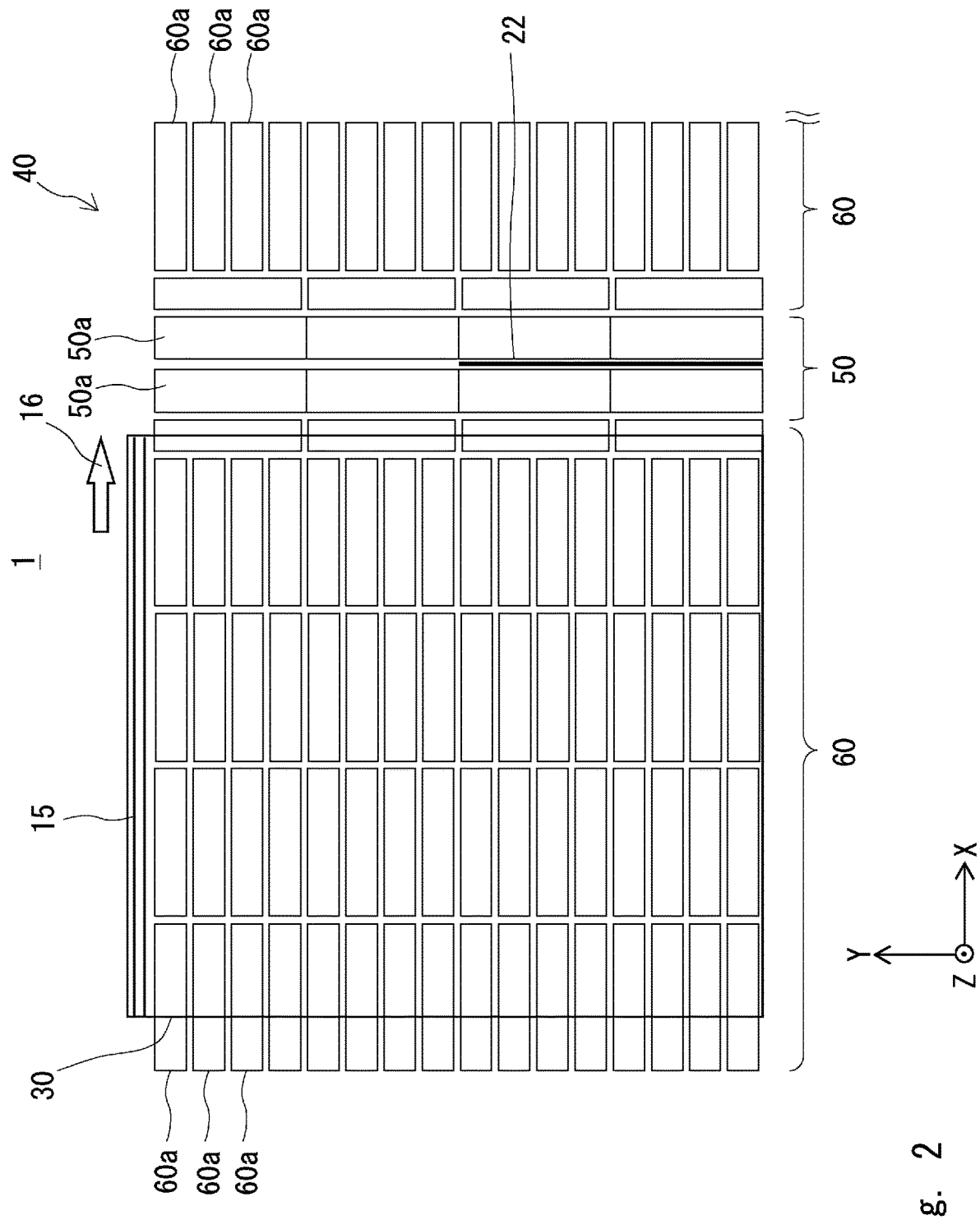
FIG. 2 is a plan view exemplifying a conveying stage of the laser processing apparatus according to the first embodiment.

A laser processing apparatus according a first embodiment will be described below. In the first embodiment, a workpiece 30 is prevented from being deformed into a dome shape, for example. FIG. 1 is a cross-sectional view exemplifying a laser processing apparatus according to the first embodiment. FIG. 2 is a plan view exemplifying a conveying stage of the laser processing apparatus according to the first embodiment. In FIG. 2, a part of the conveying stage is not presented.

As shown in FIGS. 1 and 2, the laser processing apparatus 1 includes a conveying stage 40 and a laser light irradiation unit 20. The laser processing apparatus 1 may further include a light source (not shown), and the laser light irradiation unit 20 may include a light source. The laser processing apparatus 1 is an apparatus that irradiates the workpiece 30 with laser light 21 to perform laser processing.

The conveying stage 40 is a stage capable of allowing the workpiece 30 to float and convey. The conveying stage 40 allows the workpiece 30 to float above an upper surface 40f of the conveying stage 40 and convey. The upper surface 40f of the conveying stage 40 is also referred to as a stage surface.

Here, for convenience of explanation of the laser processing apparatus 1, an XYZ orthogonal coordinate axis system is introduced. A plane parallel to the stage surface is an XY plane. A direction orthogonal to the stage surface is a Z-axis direction. For example, the XY plane is a horizontal plane. The Z-axis direction is a vertical direction, and a +Z-axis direction indicates an upward side.

The workpiece 30 is conveyed in a conveying direction 16 while floating above the upper surface 40f of the conveying stage 40. For example, the workpiece 30, an end portion of which is gripped by a gripping mechanism 15, is conveyed in the conveying direction 16. The conveying direction 16 is, for example, an +X-axis direction. The gripping mechanism 15 may grip not only the end portion of the workpiece 30 but also the central portion of the workpiece 30.

The workpiece 30 includes, for example, a substrate 31 and a semiconductor film 32 formed over the substrate 31. The substrate 31 floats from the stage surface and is conveyed while keeping a main surface of the substrate 31 parallel to the stage surface. The substrate 31 is, for example, a glass substrate or a semiconductor substrate such as a silicon substrate. The semiconductor film 32 is amorphous silicon, for example. The laser processing aims at polycrystallization, single crystallization, modification, inactivation of impurities, and stabilization of impurities of the semiconductor film 32 in the workpiece 30. For example, at least a part of the amorphous semiconductor film 32 is transformed into polycrystal by the irradiation with the laser light 21. The laser processing is not limited to the processing intended for these purposes. The laser processing may include any processing for irradiating workpiece 30 with the laser light 21 to perform heat treatment. In addition, the workpiece 30 is not limited to the workpiece including the substrate 31 and the semiconductor film 32 formed over the substrate 31 as long as being subjected to the laser processing.

The laser light irradiation unit 20 irradiates the laser light 21. The laser light irradiation unit 20 irradiates the workpiece 30 with excimer laser light, for example. The laser light 21 irradiated by the laser light irradiation unit 20 is not limited to the excimer laser light, and may be the laser light 21 according to the intended laser processing.

A region over the upper surface of the conveying stage 40 used for irradiating the substrate 31 with the laser light 21 is called a laser light irradiation region 50, and a region over the upper surface of the conveying stage 40 used for conveying the substrate 31 is called a substrate conveying region 60. The conveying stage 40 includes a plurality of members 50a forming the laser light irradiation region 50 on the upper surface of the conveying stage 40 and a plurality of members 60a forming the substrate conveying region 60 on the upper surface of the conveying stage 40.

The conveying stage 40 includes a stone surface plate 11, a metal surface plate 12, a trestle 13, a height adjustment mechanism 14, and a gripping mechanism 15 in addition to the members 50a and the members 60a. The trestle 13 is disposed over a floor surface. The stone surface plate 11 and the metal surface plate 12 are disposed over the trestle 13. The stone surface plate 11 and the metal surface plate 12 may be disposed over separate trestles 13. In order to make the drawings easier to see, some symbols are not presented in the drawings. In the drawings, there is a portion in which hatching is not presented. The stone surface plate 11 and the metal surface plate 12 support the conveying stage 40.

The stone surface plate 11 is formed of, for example, a stone material such as granite as a main component. The stone surface plate 11 is a surface plate capable of processing the flatness of the upper surface with high accuracy, has little bending during the laser processing, and can maintain the flatness. However, there is almost no large stone material that can produce the stone surface plate 11 capable of supporting all of the member 50a and the member 60a. Therefore, the stone surface plate 11 supports the member 50a that requires the flatness, such as the laser light irradiation region 50. The material of the stone surface plate 11 is not limited to the granite, and may include, as a main component, a stone material other than the granite as long as the flatness can be processed with higher accuracy compared with the metal surface plate 12.

The metal surface plate 12 is formed of, for example, an aluminum material as a main component. The material of the metal surface plate 12 is not limited to the aluminum, and may be a metal such as stainless, for example. The metal surface plate 12 can also be made large so as to support all of the member 50a and the member 60a. However, the metal surface plate 12 may have a non-negligible flexure, and has lower flatness than the stone surface plate 11. Accordingly, the members 50a requiring higher flatness than the metal surface plate 12 are supported by the stone surface plate 11 as in the laser light irradiation region 50, and the other members 60a are used in combination so as to be supported by the metal surface plate 12.

The height adjustment mechanism 14 is provided between the trestle 13 and the stone surface plate 11 and the metal surface plate 12. Therefore, the stone surface plate 11 and the metal surface plate 12 are disposed via the height adjustment mechanism 14. Although not shown, the height adjustment mechanism 14 may be provided between the trestle 13 and the floor surface. The height adjustment mechanism 14 is configured to adjust a height in a Z-axis direction by, for example, a shim plate or a wedge mechanism. The members 50a and the members 60a are disposed over the stone surface plate 11 and the metal surface plate 12, respectively. By adjustment of the height adjustment mechanism 14, the stone surface plate 11, the metal surface plate 12, and the upper surface 40f of the conveying stage 40 can be adjusted. The height adjustment mechanism 14 may be provided over the members 50a itself and the member 60a itself.

As described above, the conveying stage 40 includes the plurality of members 50a and the plurality of members 60a. The plurality of members 60a are disposed over the metal surface plate 12. Accordingly, the plurality of members 60a are supported by the metal surface plate 12. In FIG. 1, the plurality of members 60a formed over the metal surface plate 12 are collectively shown as one member, but the plurality of members 60a are actually disposed over the metal surface plate 12. Hereinafter, the plurality of members 60a may be collectively shown as one member.

The plurality of members 50a are disposed over the stone surface plate 11. The plurality of members 50a are supported by the stone surface plate 11.

The conveying stage 40 includes the laser light irradiation region 50 and the substrate conveying region 60 when the upper surface 40f is viewed in plan, that is, when is viewed in the Z-axis direction, but a part of the substrate conveying region 60 is not presented in FIG. 2. Since the plurality of members 50a are disposed over the stone surface plate 11, the laser light irradiation region 50 can also be called a region over the stone surface plate 11. The laser light irradiation region 50 is a region in which the workpiece 30 is irradiated with the laser light 21 irradiated from the laser light irradiation unit 20. In other words, more essentially, the laser light irradiation region 50 is a region in which the workpiece 30 floats with high accuracy for irradiation with the laser light 21.

The plurality of members 50a are disposed to be separated from each other in an X-axis direction. A separated gap extends in a Y-axis direction. The laser light 21 is irradiated so as to be directed toward the separated gap. A focus 22 of the laser light 21 has a linear shape extending in the Y-axis direction when viewed in the Z-axis direction. The focus 22 of the laser light 21 is located on the gap where the plurality of members 50a are separated. A groove extending in the Y-axis direction may be formed in the single member 50a, and the groove may have the same function as the gap. In other words, the focus 22 of the laser light 21 may be located on the groove.

Figure 3:
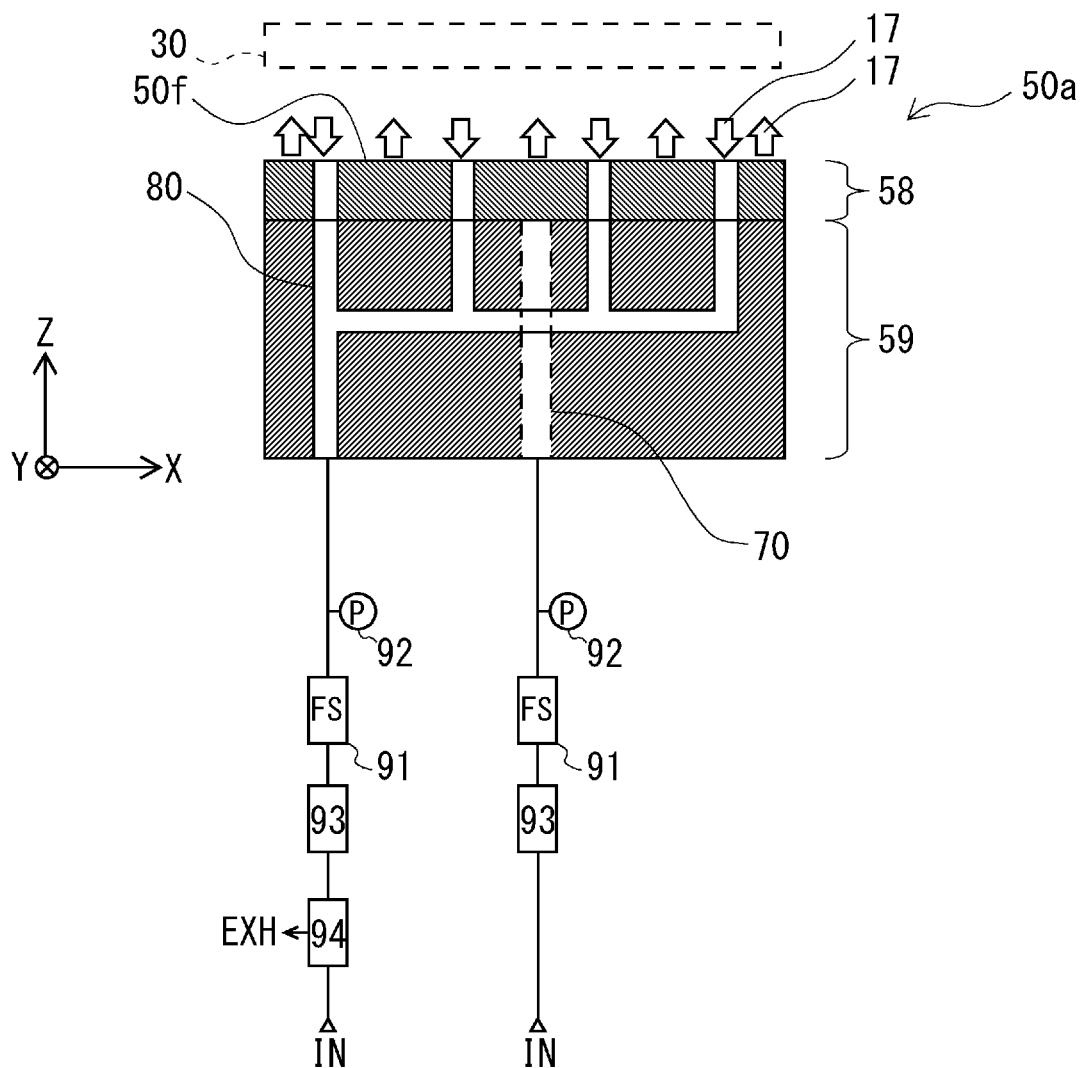
FIG. 3 is a cross-sectional view exemplifying a member forming a laser light irradiation region of the laser processing apparatus according to the first embodiment.
Figure 4:
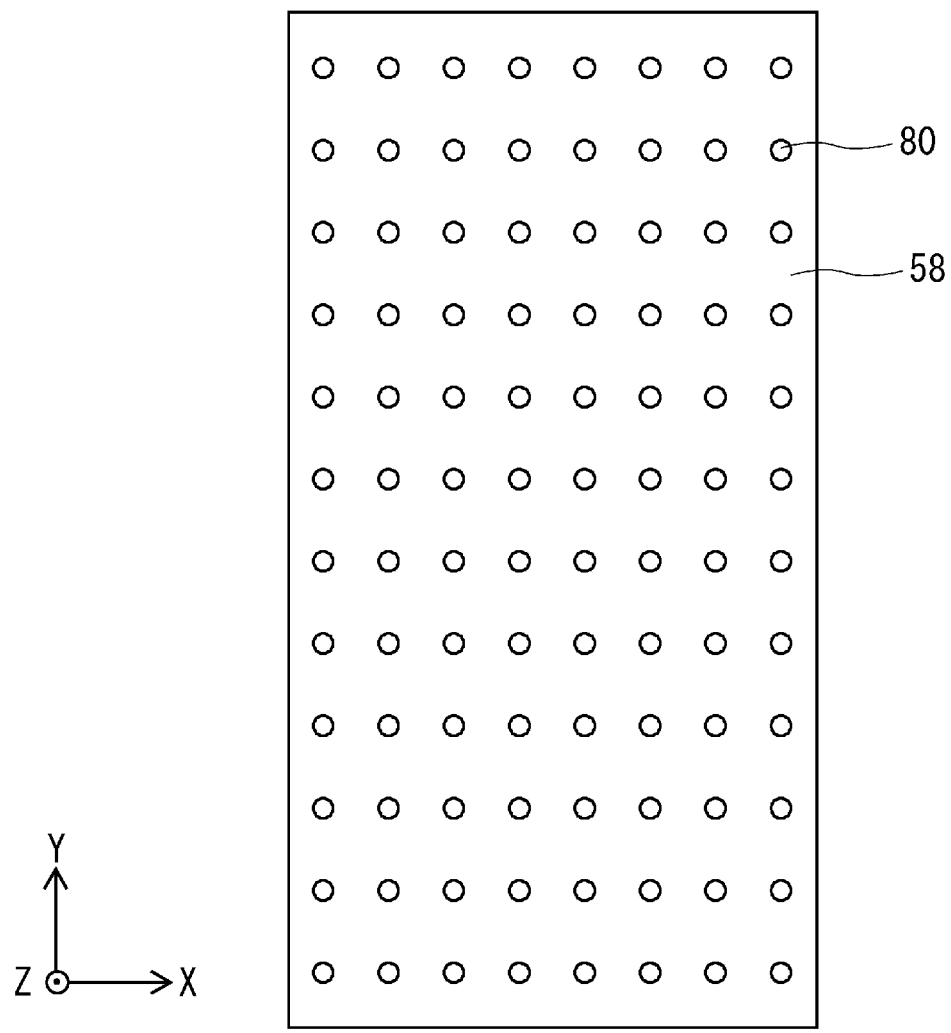
FIG. 4 is a plan view exemplifying the member forming the laser light irradiation region of the laser processing apparatus according to the first embodiment.

FIG. 3 is a cross-sectional view exemplifying the member 50a forming the laser light irradiation region 50 of the laser processing apparatus 1 according to the first embodiment. FIG. 4 is a plan view exemplifying the member 50a forming the laser light irradiation region 50 of the laser processing apparatus 1 according to the first embodiment. As shown in FIGS. 3 and 4, the member 50a can jet a predetermined gas 17 to float the workpiece 30. The predetermined gas 17 is, for example, nitrogen, air, or an inert gas. The member 50a includes a porous body 58 and a pedestal 59. The porous body 58 is disposed over the pedestal 59. The member 50a includes the porous body 58 made of, for example, carbon (C), ceramics, or chromium (Cr). The pedestal 59 is made of, for example, a metal.

An exhaust pipe 70 is connected to the member 50a. The exhaust pipe 70 penetrates the pedestal 59, and is connected to the porous body 58. The predetermined gas 17 is supplied to the porous body 58 through the exhaust pipe 70. In the member 50a, the predetermined gas 17 can be jet from the porous body. The predetermined gas 17 is discharged so as to effuse from minute pores in the porous body. The predetermined gas 17 jets out from the member 50a to the workpiece 30 through the porous body 58. This can allow the workpiece 30 to float over an upper surface 50f of the member 50a. A surface of the laser light irradiation region 50 facing the workpiece 30 includes the upper surface 50f of the member 50a.

A flow rate or a pressure of the predetermined gas 17 passing through the exhaust pipe 70 can be controlled. For example, a flow meter 91, a pressure gauge 92, and a throttle valve 93 are connected to the exhaust pipe 70. Then, the flow rate or the pressure of the predetermined gas 17 in the exhaust pipe 70 can be adjusted by the throttle valve 93.

In addition, an intake pipe 80 is connected to the member 50a. Unlike the exhaust pipe 70, the intake pipe 80 penetrates the porous body 58 and the pedestal 59 of the member 50a. The predetermined gas 17 jetting out between the upper surface 50f of the member 50a and the workpiece 30 can be sucked through the intake pipe 80.

A flow rate or a pressure of the predetermined gas 17 passing through the intake pipe 80 can be controlled. For example, a flow meter 91, a pressure gauge 92, and a throttle valve 93 are connected to the intake pipe 80. Then, the flow rate or the pressure of the predetermined gas 17 in the intake pipe 80 can be adjusted by the throttle valve 93. The flow rate or the pressure of the predetermined gas 17 in the intake pipe 80 may be adjusted by a vacuum regulator 94.

The member 50a is a member that performs exhaust and intake. In the laser light irradiation region 50, a floating height of the workpiece 30 from the upper surface 50f of the member 50a is set to, for example, 10 to 30 [μm]. In the laser light irradiation region 50, the member 50a can increase control accuracy of the floating height by adjusting the exhaust gas and the intake gas using the throttle valve 93.

In the laser light irradiation region 50, the workpiece 30 is irradiated with the laser light 21 irradiated from the laser light irradiation unit 20. At this time, it is necessary to put a to-be-processed portion of the workpiece 30 within the range of a depth of focus (DOF) of the laser light 21. The depth of focus is, for example, in the range of 30 [μm] along an optical axis with the focus of the laser light 21 as a center. The to-be-processed portion of the workpiece 30 is, for example, the semiconductor film 32 formed over the substrate 31.

In the laser light irradiation region 50, when the workpiece 30 is irradiated with the laser light 21, it is necessary to restrain the workpiece 30 so that the workpiece 30 is not deformed or displaced by the influence of heat. Therefore, floating accuracy or floating stiffness of the workpiece 30 in the laser light irradiation region 50 are important. Therefore, the laser light irradiation region 50 is in a non-contact adsorption state in which the predetermined gas 17 jets out toward the workpiece 30 and the predetermined gas 17 jetting out between the workpiece 30 and the member 50a is sucked.

In the laser light irradiation region 50, since it is necessary to control to put the workpiece 30 within the range of the depth of focus of the laser light 21 with accuracy, the member 50a is disposed over the stone surface plate 11. The stone surface plate 11 can process the upper surface with high flatness accuracy and has little flexure. Accordingly, the flatness of the upper surface 50f of the member 50a disposed over the stone surface plate 11 can be improved.

The substrate conveying region 60 is a region in which the plurality of members 60a are disposed when viewed in the Z-axis direction. In addition, since the plurality of members 60a are disposed over the metal surface plate 12, the substrate conveying region 60 can be called a region over the metal surface plate 12. The substrate conveying region 60 is a region separated from the laser light irradiation region 50. For example, the laser light irradiation region 50 and the substrate conveying region 60 are arranged in the X-axis direction on the upper surface 40f of the conveying stage 40. The laser light irradiation region 50 is sandwiched between the substrate conveying regions 60 from both sides in the X-axis direction.

The plurality of members 60a are disposed, for example, in a matrix shape over the metal surface plate 12 when viewed in the Z-axis direction. The plurality of members 60a are disposed so as to be separated from each other. Each of the members 60a has lengths of, for example, 1000 [mm] and 200 [mm] in the X-axis direction and the Y-axis direction. The lengths of the member 60a in the X-axis direction and the Y-axis direction is not limited thereto, and may be, for example, 200 [mm] and 1000 [mm] or may be other dimensions.

A width of the gap between the members 60a adjacent to each other in the X-axis direction and the Y-axis direction is 10 [mm], for example. The width of the gap may change depending on the length of each side of the member 60a, but for example, the gap in the Y-axis direction is 2 to 60 [mm]. The length of the member 60a in the Y-axis direction is defined as L, the minimum width of the gap in the Y-axis direction is defined as Lmin, and the maximum width of the gap in the Y-axis direction is defined as Lmax. Then, expressions (1) and (2) are established as follows.

$$Lmin = n1 \times L \quad (1)$$

$$Lmax = n2 \times L \quad (2)$$

Here, a relation between n1 and n2 is, for example, 0<n1 and n2<1, n1 is, for example, 0.01, and n2 is, for example, 0.3. A relation between the length of the member 60a in the X-axis direction and the width of the gap may also be made to establish the expressions (1) and (2).

Figure 5:
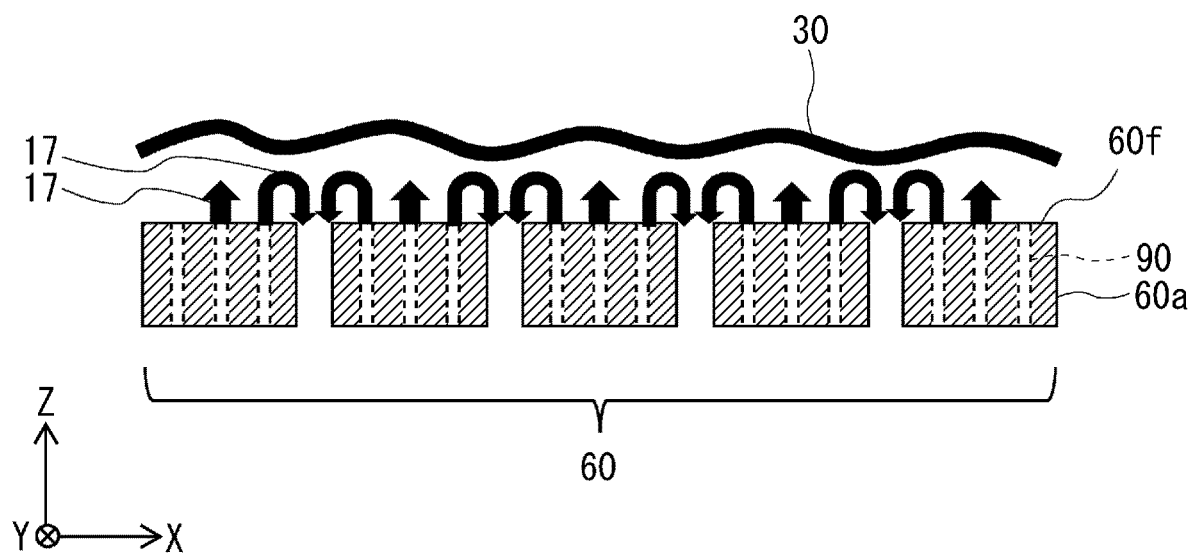
FIG. 5 is a cross-sectional view exemplifying a member forming a substrate conveying region of the laser processing apparatus according to the first embodiment.

FIG. 5 is a cross-sectional view exemplifying the member 60a forming the substrate conveying region 60 of the laser processing apparatus 1 according to the first embodiment. As shown in FIG. 5, each of the members 60a in the conveying stage 40 can jet the predetermined gas 17 to float the workpiece 30. Each of the members 60a includes a plurality of through holes 90 through which the predetermined gas 17 can jet out. The surface of the substrate conveying region 60 facing the workpiece 30 includes upper surfaces 60f of the plurality of members 60a. Although only a few through holes 90 are shown in the drawing for the sake of clarify, each of the members 60a may include a large number of through holes 90. The predetermined gas 17 is, for example, nitrogen, air, or an inert gas. The member 60a is made of, for example, a metal containing aluminum (Al) as a main component.

The flow rate or the pressure of the predetermined gas 17 passing through the through hole 90 can be controlled. For example, although not shown, a flow meter, a pressure gauge, and a throttle valve are connected to the through hole. The flow rate or the pressure of the predetermined gas 17 in the through hole 90 can be adjusted by the throttle valve.

Each of the members 60a is a member that performs only exhaust. In the substrate conveying region 60, the floating height is controlled by adjustment of the exhaust of the member 60a using the throttle valve. Accordingly, the control accuracy of the floating height of the workpiece 30 in the substrate conveying region 60 may be lower than the control accuracy of the floating height of the workpiece 30 in the laser light irradiation region 50. For example, when the floating height of the workpiece 30 in the laser light irradiation region 50 is set to be 10 to 30 [μm], the control accuracy is 20±10 [μm]. When the floating height of the workpiece 30 from the upper surface 60f of each of the members 60a is set to be, for example, 300 to ~500 [μm], the control accuracy is 400±100 [μm].

In the substrate conveying region 60, the respective members 60a are arranged side by side with a gap. Thus, the predetermined gas 17 jets out toward the workpiece 30 and is exhausted between the workpiece 30 and each of the members 60a can be escaped below the each of the members 60a from the gap. Thereby, the retention of air can be eliminated and the workpiece 30 can be prevented from being deformed into a dome shape. As a result, it is possible to obtain an appropriate floating height of the corner portion and the edge portion 39 of the workpiece 30.

In the substrate conveying region 60, the control accuracy of the floating height is lower than the control accuracy of the floating height in the laser light irradiation region 50, and the required size is large corresponding to the large-sized workpiece 30, so that the inexpensive metal surface plate 12 is used. The reason why the control accuracy is low in the substrate conveying region 60 is that there is a background in which the workpiece 30 and the member 60a may not come into contact with each other.

In the laser processing apparatus 1 according to the first embodiment, it is possible to prevent the shape of the workpiece 30 from being deformed into a dome shape.

Second Embodiment

A second embodiment will be described below. First, problems different from those of the laser processing apparatus 1 according to the first embodiment will be described. Then, a laser processing apparatus 2 according to the second embodiment will be described.

Figure 6:
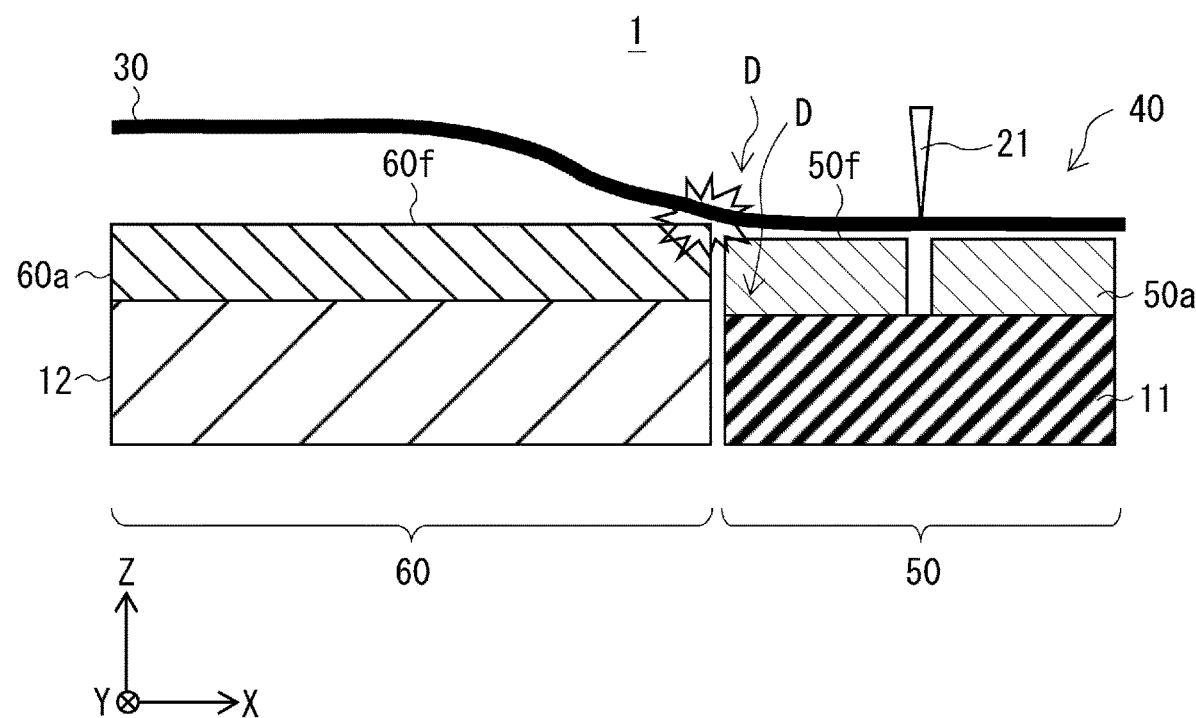
FIG. 6 is a cross-sectional view exemplifying a problem of the laser processing apparatus according to the first embodiment.
Figure 7:
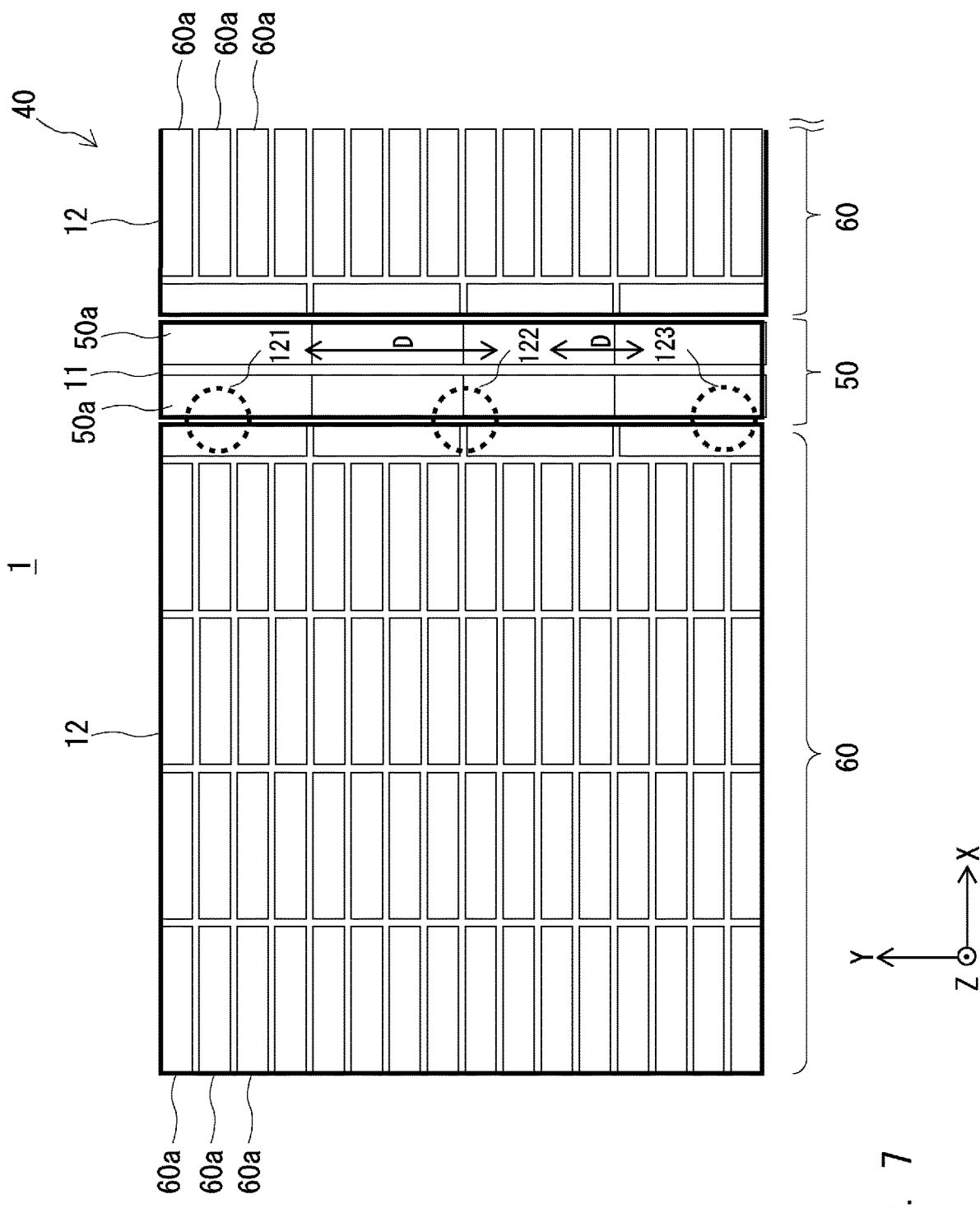
FIG. 7 is a plan view exemplifying a problem of the laser processing apparatus according to the first embodiment.

FIG. 6 is a cross-sectional view exemplifying the problem of the laser processing apparatus 1 according to the first embodiment. FIG. 7 is a plan view exemplifying the problem of the laser processing apparatus 1 according to the first embodiment. As shown in FIGS. 6 and 7, the conveying stage 40 is disposed over the stone surface plate 11 and the metal surface plate 12. The conveying stage 40 is preferably disposed over the stone surface plate 11 as a whole from the viewpoint of the flatness. The stone surface plate 11 is easy to obtain the accuracy of the flatness of the upper surface during processing. Accordingly, the workpiece 30 can be processed accurately on the conveying stage 40 disposed over the stone surface plate 11.

However, there is almost no large stone material that can produce the stone surface plate 11 capable of supporting the entire conveying stage 40. Therefore, such a material is also expensive, if any, and processing and transportation are also expensive, which are unfavorable in terms of costs. Accordingly, the stone surface plate 11 is used only in the laser light irradiation region 50 that requires highly accurate flatness for irradiation with the laser light 21.

On the other hand, the substrate conveying region 60 does not require the accuracy in the flatness as much as in the laser light irradiation region 50. Further, since stage surface corresponding to the large-sized workpiece 30 is required, the inexpensive metal surface plate 12 is used. However, compared with the stone surface plate 11, there may be a case where a non-negligible flexure occurs in the metal surface plate 12. Then, a step D may occur between the upper surface 50f of the member 50a and the upper surfaces 60f of the plurality of members 60a. The step D is such that the upper surface 50f of the member 50a is lower than the upper surface 60f of the member 60a. The step D may be such that the upper surface 60f is lower than the upper surface 50f.

As shown in FIG. 7, since the metal surface plate 12 is easily bent, the end portion of the metal surface plate 12 closer to the stone surface plate 11 is bent at a micron level, and the step D is distributed at a micron level between the metal surface plate 12 and the stone surface plate 11 in a plan view. For example, the step D occurs in the Z-axis direction between the +Y-axis direction side 121 and the central portion 122 between the metal surface plate 12 and the stone surface plate 11 or between the central portion 122 and the −Y-axis direction side 123. Then, the step D between the metal surface plate 12 and the stone surface plate 11 is also reflected also between the member 60a and the member 50a. As a result, the step D also occurs between the upper surface 60f of the member 60a and the upper surface 50f of the member 50a. The step D reflected between the member 60a and the member 50a is a non-negligible step D with respect to the floating height (10 to 30 [μm]) in the laser light irradiation region 50 even at the micron level.

Examples of the occurrence cause of the step D include, in addition to the flexure of the metal surface plate 12, a tolerance of the upper surface of the metal surface plate 12, a tolerance of a thickness of the member 60a, and an error of the height adjustment mechanism.

As shown in FIG. 6, when the step D occurs between the laser light irradiation region 50 and the substrate conveying region 60, the workpiece 30 may come into contact with the end portion of the member 60a when moving from the substrate conveying region 60 to the laser light irradiation region 50. Since the floating height in the laser light irradiation region 50 is as low as 10 to 30 [μm], there is a possibility of contact even when the step D is about 10 [μm]. Then, the contact between the workpiece 30 and the member 60a causes problems such as damage to the workpiece 30 and generation of dust. For example, the generation of dust causes uneven irradiation with the laser light 21 and reduces the performance of the laser irradiation apparatus.

A laser processing apparatus 2 according to the second embodiment will be described below. The laser processing apparatus 2 of the second embodiment differs from the laser processing apparatus 1 of the first embodiment in that a substrate conveying region 60 and a shift region 61 are provided over the metal surface plate 12.

Figure 8:
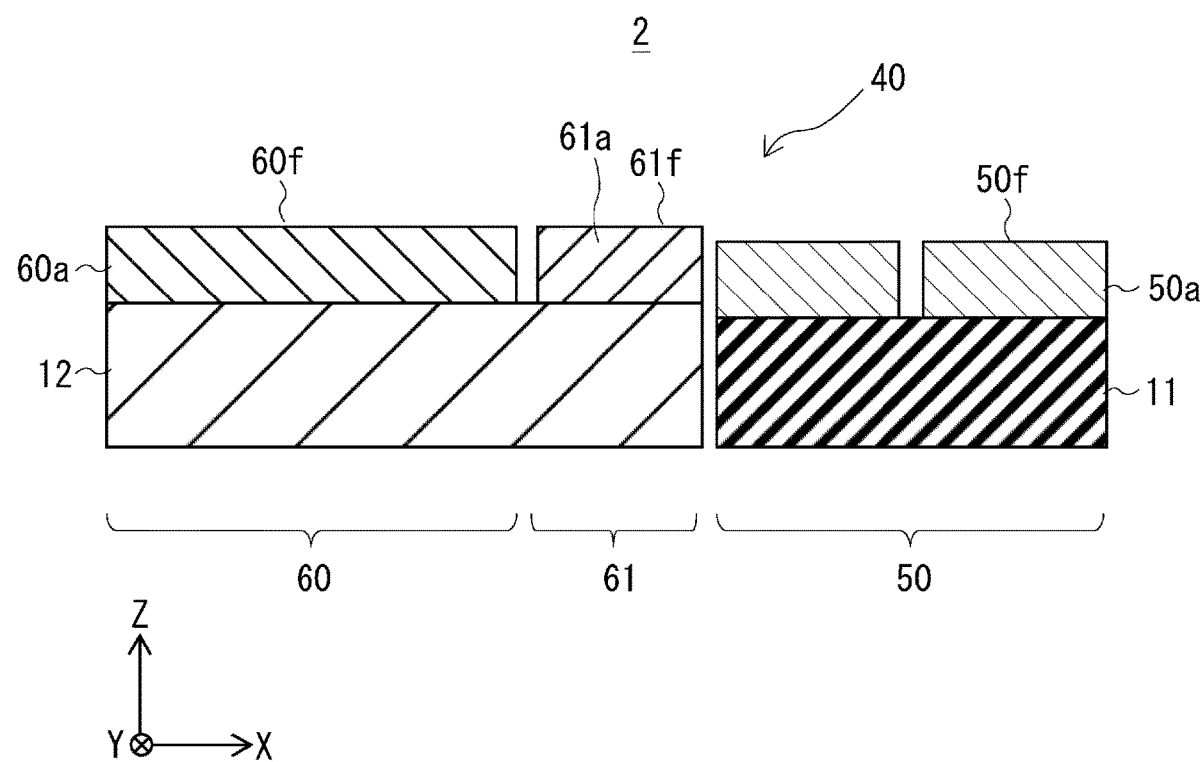
FIG. 8 is a cross-sectional view exemplifying a conveying stage of a laser processing apparatus according to a second embodiment.
Figure 9:
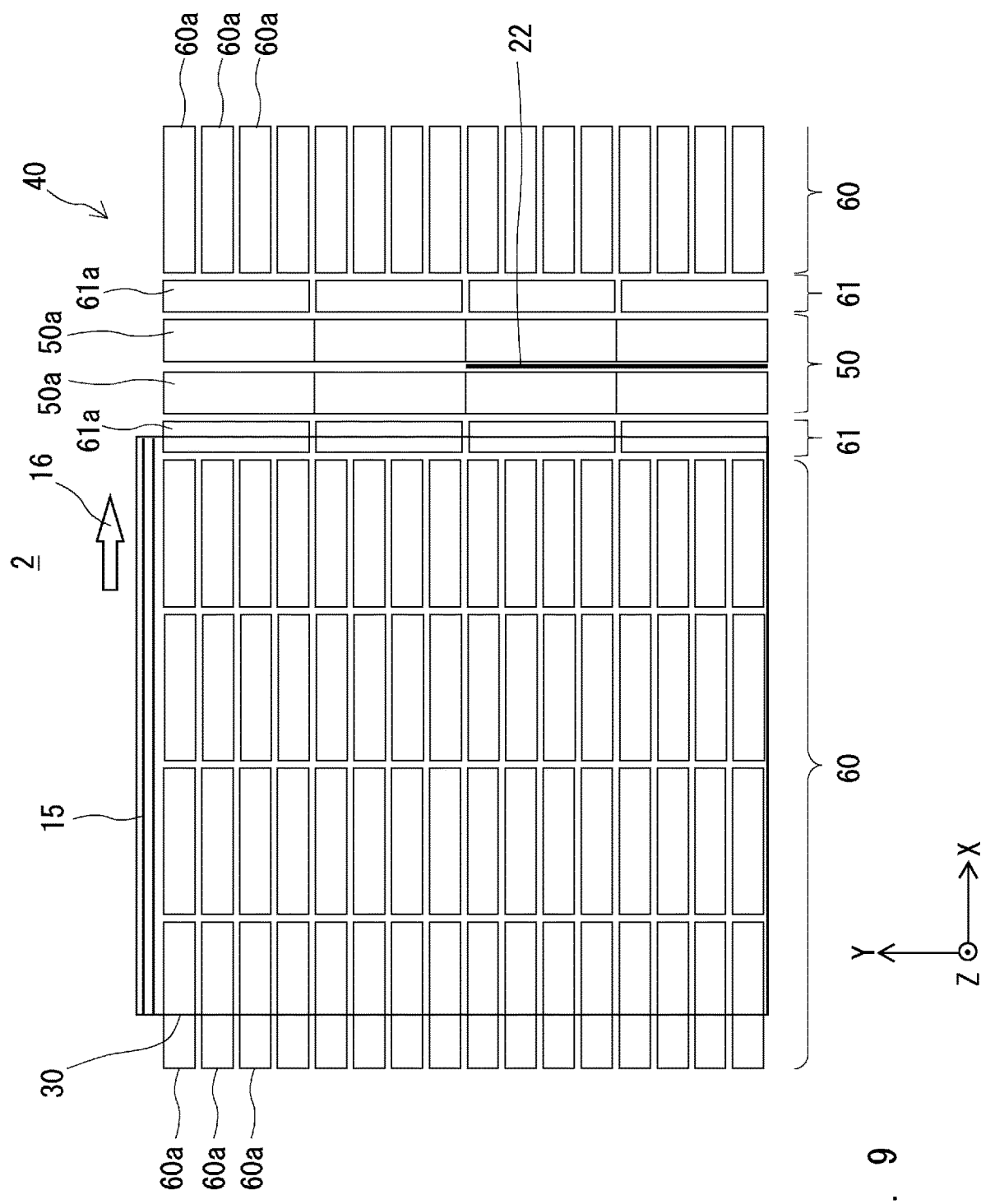
FIG. 9 is a plan view exemplifying the conveying stage of the laser processing apparatus according to the second embodiment.

FIG. 8 is a cross-sectional view exemplifying the conveying stage 40 of the laser processing apparatus 2 according to the second embodiment. FIG. 9 is a plan view exemplifying the conveying stage 40 of the laser processing apparatus 2 according to the second embodiment. As shown in FIGS. 8 and 9, the laser processing apparatus 2 according to the second embodiment is configured in which a plurality of members 61a forming the shift region 61 are disposed over the metal surface plate 12 in addition to the plurality of members 60a. In FIG. 8, the components such as the metal surface plate 12, the member 60a, and the member 61a disposed on the +X-axis direction side of the stone surface plate 11 are not presented. In FIG. 9, some of such components are not presented. Actually, the metal surface plate 12, the plurality of members 60a, and the plurality of members 61a are also disposed on the +X-axis direction side of the stone surface plate 11.

The plurality of members 61a are disposed over the metal surface plate 12 closer to the laser light irradiation region 50. Accordingly, the plurality of members 61a are disposed between the plurality of members 60a and the plurality of members 50a. Each of the members 61a may have an outer shape similar to that of the member 60a. In FIG. 8, the plurality of members 61a formed over the metal surface plate 12 are collectively shown as one member, but the plurality of members 61a are actually disposed over the metal surface plate 12. Hereinafter, the plurality of members 61a may be collectively shown as one member.

The shift region 61 is a region in which the members 61a are disposed in a plan view, that is, when viewed in the Z-axis direction. Therefore, the substrate conveying region 60 and the shift region 61 are disposed over the metal surface plate 12. As described above, the conveying stage 40 further includes the shift region 61 disposed between the laser light irradiation region 50 and the substrate conveying region 60. The shift region 61 is disposed between the substrate conveying region 60 and the laser light irradiation region 50. In addition, the laser light irradiation region 50 is sandwiched between the shift regions 61.

Gaps are provided between the adjacent members 61a and between the member 61a and the member 60a adjacent to each other. The gap may have a width similar to that of the gap between the members 60a adjacent to each other. Accordingly, a relation between the length of the member 61a in the X-axis direction and the Y-axis direction and the gap satisfies the expressions (1) and (2).

Each of the members 61a is a member that performs exhaust as in the member 60a. In other words, each of the members 61a can jet the predetermined gas 17 to float the workpiece 30. Each of the members 61a includes a plurality of through holes (not shown) through which the predetermined gas 17 can jet out. The functions of the through hole, the flow meter, the pressure gauge, and the throttle valve in each of the members 61a are equal to those of the member 60a, and the flow rate or the pressure of the predetermined gas 17 can be adjusted. The member 61a may also perform intake. For example, the member 61a has the same structure as the member 50a, and may be provided with an exhaust pipe and an intake pipe. The flow rate or the pressure of the predetermined gas 17 passing through the exhaust pipe and the intake pipe may be controllable.

A surface of the shift region 61 facing the workpiece 30 includes upper surfaces 61f of the plurality of members 61a. The control accuracy of the floating height of the workpiece 30 in the shift region 61 is higher than the control accuracy of the floating height of the workpiece 30 in the substrate conveying region 60. For example, the floating height of the workpiece 30 in the shift region 61 is set to be 50 to 150 [μm]. For example, the floating height can be set to be 50 to 150 [μm] by control of the amount of the predetermined gas 17 jetting out from the member 61a. Accordingly, the control accuracy of the floating height is 100±50 [μm]. On the other hand, the floating height of the workpiece 30 in the substrate conveying region 60 is set to be 300 to 500 [μm], and the control accuracy of the floating height is 400±100 [μm]. Other configurations of the laser processing apparatus 2 according to the second embodiment are similar to those of the first embodiment.

In the present embodiment, the floating height of the workpiece 30 in the substrate conveying region 60 is set to be 300 to 500 [μm]. The floating height of the workpiece 30 in the shift region 61 is set to be 50 to 150 [μm]. The floating height of the workpiece 30 in the laser light irradiation region 50 is set to be 10 to 30 [μm]. Therefore, the shift region 61 is provided to prevent a sudden change in the floating height of the workpiece 30 when the workpiece 30 moves from the substrate conveying region 60 to the laser light irradiation region 50.

Third Embodiment

A third embodiment will be described below. First, problems of the laser processing apparatus 2 according to the second embodiment will be described. Then, a laser processing apparatus 3 according to the third embodiment will be described.

Figure 10:
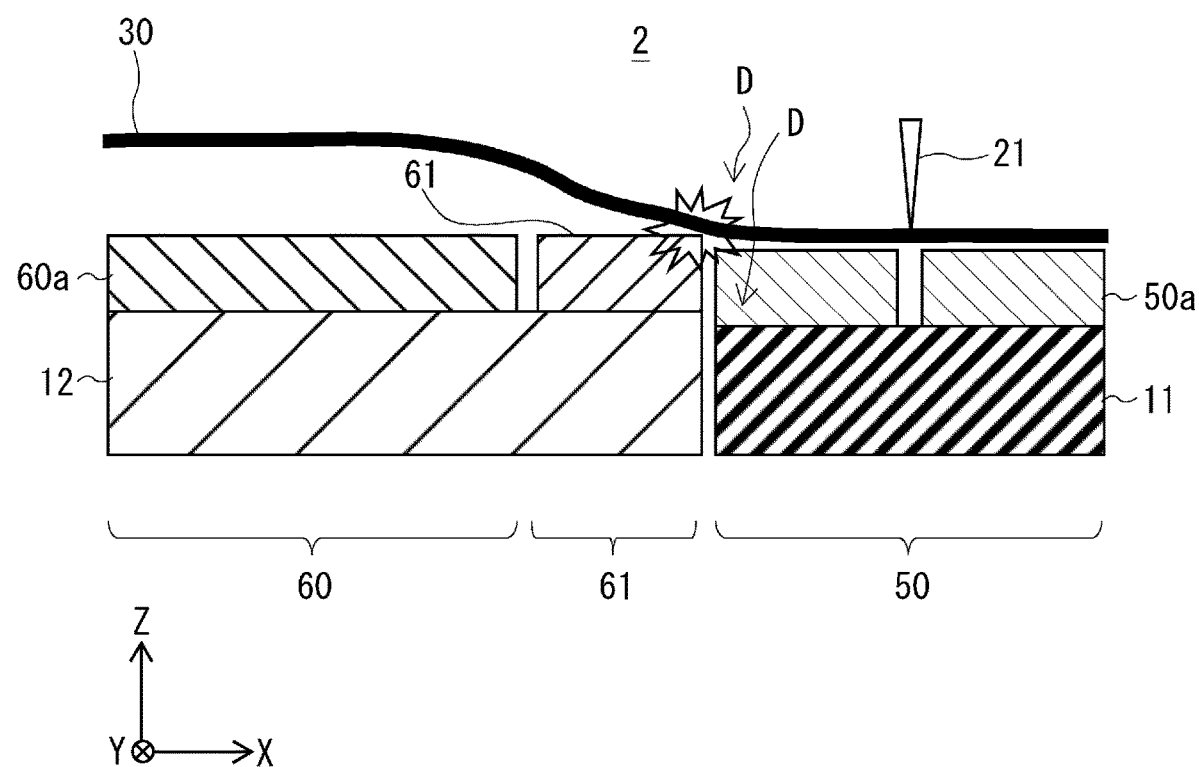
FIG. 10 is a cross-sectional view exemplifying a problem of the laser processing apparatus according to the second embodiment.

FIG. 10 is a cross-sectional view exemplifying the problem of the laser processing apparatus 2 according to the second embodiment. As shown in FIG. 10, the floating height of the workpiece 30 in the shift region 61 is about 50 to 150 [μm], while the floating height of the workpiece 30 in the laser light irradiation region 50 is as low as about 10 to 30 [μm]. Therefore, there is a possibility of contact even when the step D between the shift region 61 and the laser light irradiation region 50 is about 10 [μm]. Accordingly, as in the first embodiment, the contact between the workpiece 30 and the conveying stage 40 causes problems such as damage to the workpiece 30 and generation of dust, which reduce the reduces the performance of the laser irradiation apparatus.

Figure 11:
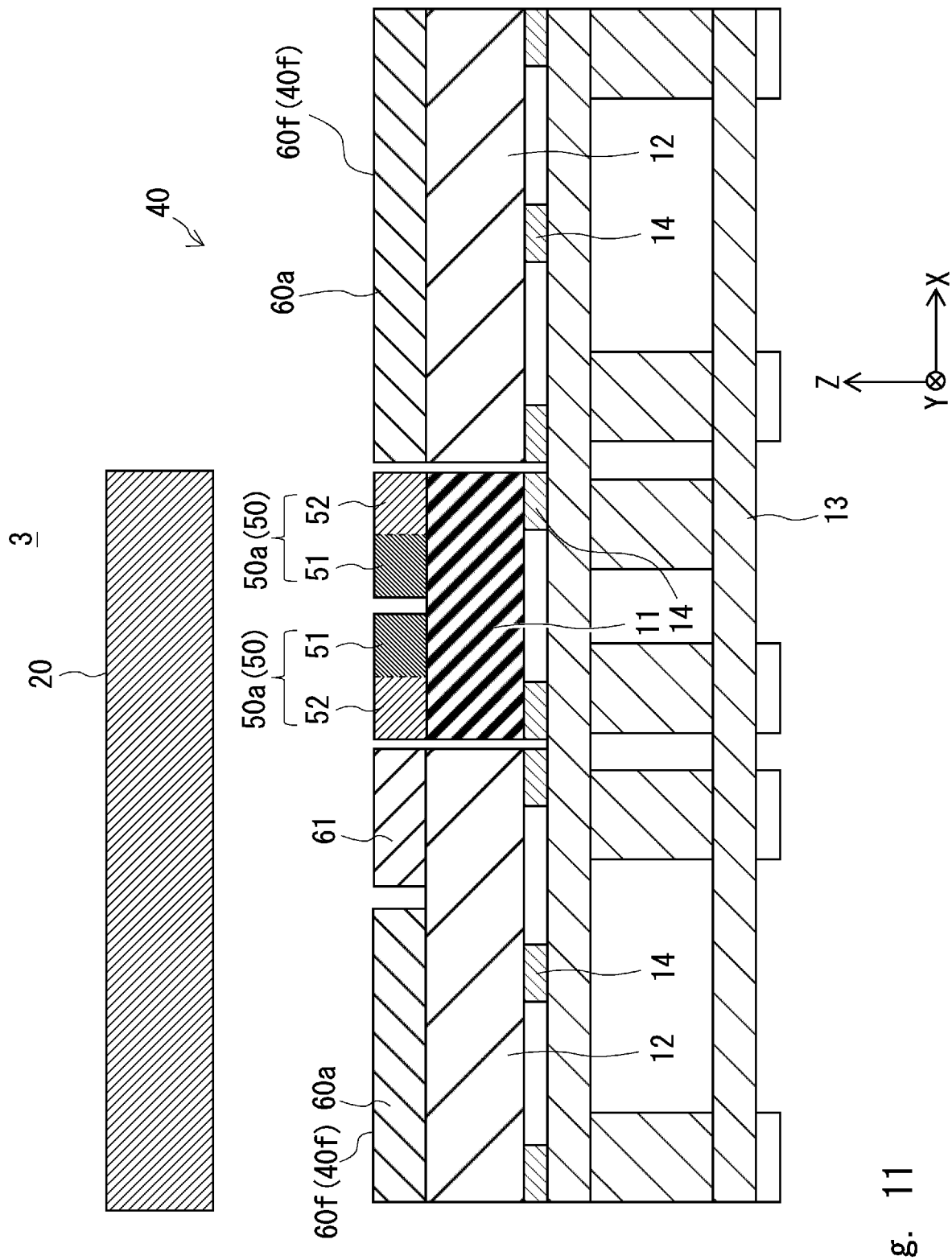
FIG. 11 is a cross-sectional view exemplifying a laser processing apparatus according to a third embodiment.
Figure 12:
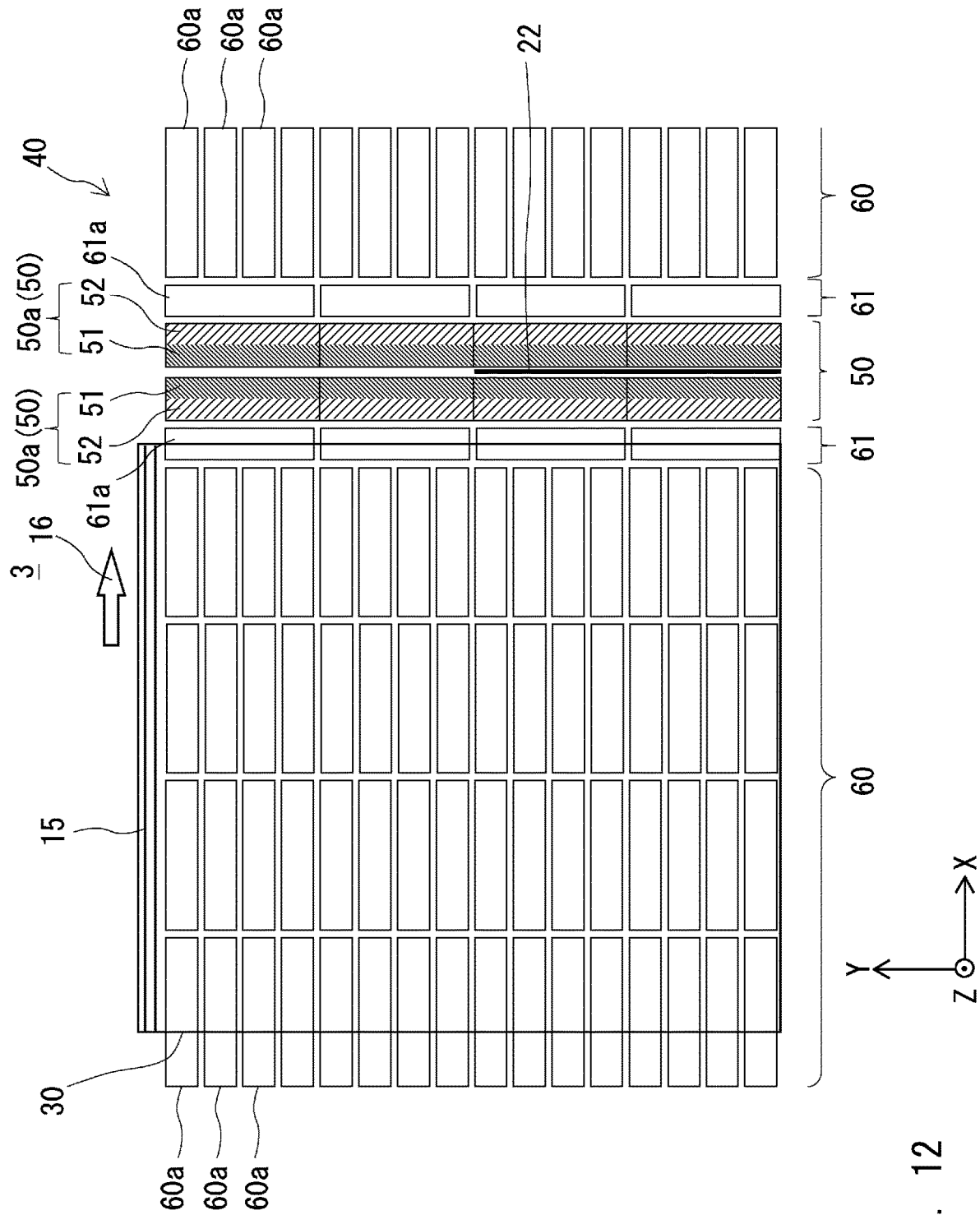
FIG. 12 is a plan view exemplifying a conveying stage of the laser processing apparatus according to the third embodiment.

The laser processing apparatus 3 according to the third embodiment will be described below. The laser processing apparatus 3 according to the third embodiment differs from the laser processing apparatuses according to the first and second embodiment in that a low floating height region 51 and a medium floating height region 52 are provided over the stone surface plate 11. FIG. 11 is a cross-sectional view exemplifying the laser processing apparatus 3 according to the third embodiment. FIG. 12 is a plan view exemplifying a conveying stage 40 of the laser processing apparatus 3 according to the third embodiment.

As shown in FIGS. 11 and 12, in the laser processing apparatus 3 according to the third embodiment, the members 50a over the stone surface plate 11 is divided into a low floating height region 51 and a medium floating height region 52. In other words, the low floating height region 51 and the medium floating height region 52 are regions in the member 50a. The medium floating height region 52 is disposed in the member 50a so as to be closer to the substrate conveying region 60. For example, when the substrate conveying region 60 is disposed on a side in the −X-axis direction of the member 50a, the medium floating height region 52 is a region on the side in the −X-axis direction of the member 50a. The member 50a is divided into the low floating height region 51 and the medium floating height region 52, but the member 50a is a single member.

The laser light irradiation region 50 includes the low floating height region 51 and the medium floating height region 52 adjacent to the low floating height region 51 in a plan view (that is, when viewed in the Z-axis direction (hereinafter, the same applies)). The low floating height region 51 and the medium floating height region 52 are disposed side by side in the X-axis direction. The medium floating height region 52 is disposed between the shift region 61 and the low floating height region 51. The low floating height region 51 overlaps a focus of the laser light 21 in a plan view.

The floating height of the workpiece 30 in the low floating height region 51 is set to be 10 to 30 [μm]. The floating height of the workpiece 30 in the medium floating height region 52 is set to be 50 to 150 [μm]. Therefore, the floating height of the substrate 31 in the medium floating height region 52 is larger than that in the low floating height region 51.

Figure 13:
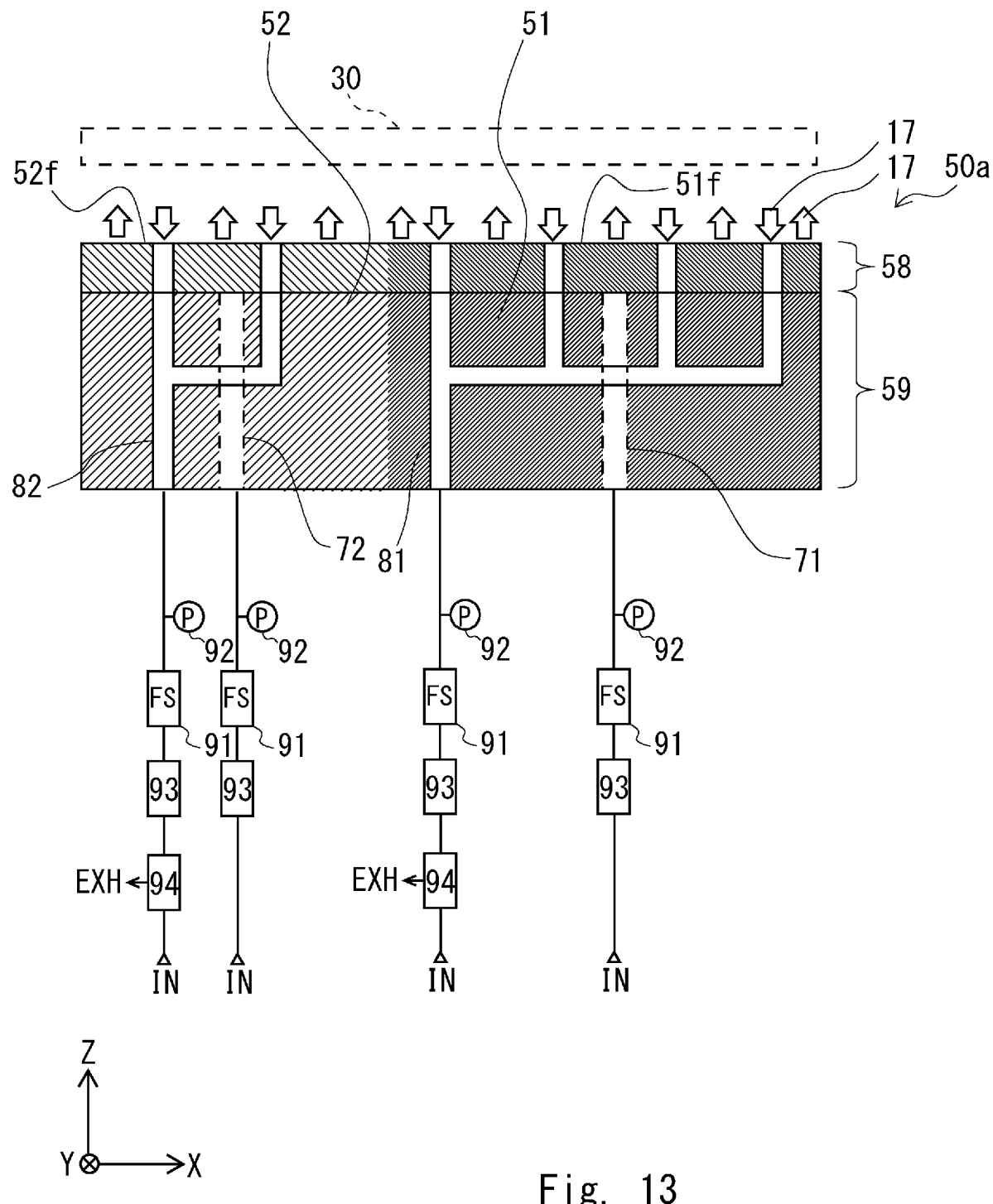
FIG. 13 is a cross-sectional view exemplifying a member forming a laser light irradiation region of the laser processing apparatus according to the third embodiment.
Figure 14:
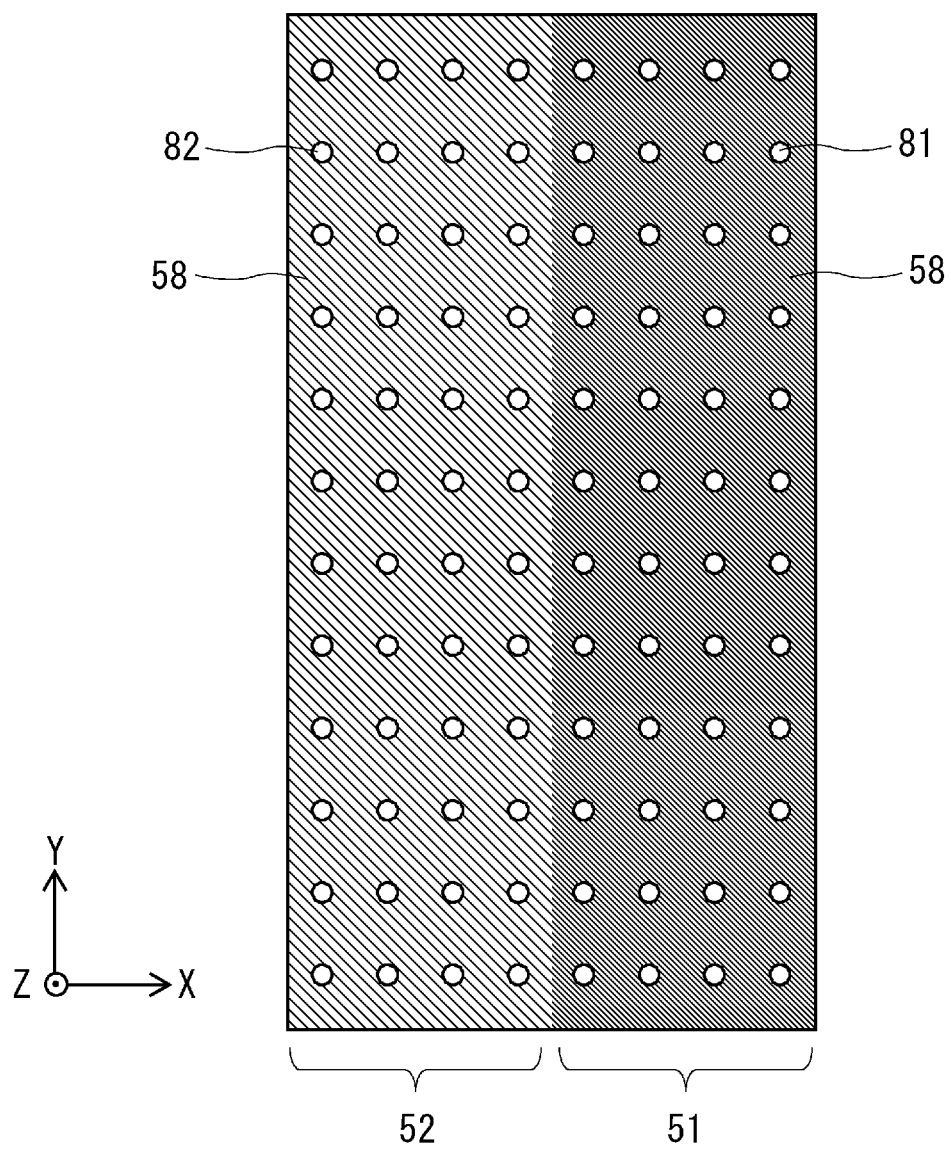
FIG. 14 is a plan view exemplifying the member forming the laser light irradiation region of the laser processing apparatus according to the third embodiment.

FIG. 13 is a cross-sectional view exemplifying the member 50a forming the laser light irradiation region 50 of the laser processing apparatus 3 according to the third embodiment. FIG. 14 is a plan view exemplifying the member 50a forming the laser light irradiation region 50 of the laser processing apparatus 3 according to the third embodiment. As shown in FIGS. 13 and 14, the member 50a includes the low floating height region 51 and the medium floating height region 52 in a plan view. The low floating height region 51 and the medium floating height region 52 in the member 50a can jet the predetermined gas 17 to float the workpiece 30. The low floating height region 51 and the medium floating height region 52 in the member 50a include a porous body 58 and a pedestal 59. The porous body 58 is disposed over the pedestal 59.

An exhaust pipe 71 is connected in the low floating height region 51, and an exhaust pipe 72 is connected in the medium floating height region 52. Specifically, the exhaust pipe 71 penetrates the pedestal 59 and is connected to the porous body 58. The predetermined gas 17 is supplied to the porous body 58 through the exhaust pipe 71. In the low floating height region 51, the predetermined gas 17 can jet out from the porous body 58. The predetermined gas 17 is discharged so as to effuse from minute pores in the porous body 58. The predetermined gas 17 jets out from the low floating height region 51 to the workpiece 30 through the porous body 58.

In the medium floating height region 52, the predetermined gas 17 jets out from the medium floating height region 52 to the workpiece 30 through the porous body 58 as in the low floating height region 51. In this way, the predetermined gas is supplied to the member 50a through the exhaust pipe 71 and the exhaust pipe 72. For example, the predetermined gas is supplied to the porous body of the member 50a. Then, the predetermined gas 17 jets out from the member 50a to the workpiece 30.

The flow rates or the pressures of the predetermined gas respectively passing through the exhaust pipe 71 and the exhaust pipe 72 are independently controlled. For example, a flow meter 91, a pressure gauge 92, and a throttle valve 93 are connected to the exhaust pipe 71 and the exhaust pipe 72. The flow rate or the pressure of the predetermined gas 17 in the exhaust pipe 71 and the exhaust pipe 72 can be adjusted by the throttle valve 93.

In addition, an intake pipe 81 is connected in the low floating height region 51, and an intake pipe 82 is connected in the medium floating height region 52. Specifically, unlike the exhaust pipe 71, the intake pipe 81 penetrates the porous body 58 and the pedestal 59 in the low floating height region 51. The predetermined gas 17 jetting out between the upper surface 51f of the low floating height region 51 and the workpiece 30 can be sucked through the intake pipe 81.

Similarly to the low floating height region 51, in the medium floating height region 52, the predetermined gas 17 jetting out between the upper surface 52f of the medium floating height region 52 and the workpiece 30 can also be sucked through the intake pipe 82. In this way, the predetermined gas 17 is sucked into the member 50a through the intake pipe 81 and the intake pipe 82.

The flow rates or the pressures of the predetermined gas respectively passing through the intake pipe 81 and the intake pipe 82 are independently controlled. For example, a flow meter 91, a pressure gauge 92, and a throttle valve 93 are connected to the intake pipe 81 and the intake pipe 82. The flow rate or the pressure of the predetermined gas 17 in the intake pipe 81 and the intake pipe 82 can be adjusted by the throttle valve 93. The flow rate or the pressure of the predetermined gas 17 in the intake pipe 81 and the intake pipe 82 may be adjusted by a vacuum regulator 94.

In the present embodiment, the floating height of the workpiece 30 in the substrate conveying region 60 is set to be 300 to 500 [μm]. The floating height of the workpiece 30 in the shift region 61 is set to be 50 to 150 [μm]. Accordingly, the floating height of the substrate 31 in the substrate conveying region 60 is larger than that in the shift region 61.

The floating height of the workpiece 30 in the medium floating height region 52 of the laser light irradiation region 50 is set to be 50 to 150 [μm]. Accordingly, the floating height of the substrate in the medium floating height region 52 is substantially equal to that in the shift region 61. The floating height of the workpiece 30 in the low floating height region 51 of the laser light irradiation region 50 is set to be 10 to 30 [μm]. Accordingly, the floating height of the substrate 31 in the shift region 61 is larger than that in the low floating height region 51.

The control accuracy of the floating height of the workpiece 30 in the low floating height region 51 is higher than the control accuracy of the floating height of the workpiece 30 in the medium floating height region 52. For example, when the floating height of the workpiece 30 in the low floating height region 51 is set to be 10 to 30 [μm], the control accuracy is 20±10 [μm]. When the floating height of the workpiece 30 in the medium floating height region 52 is set to be 50 to 150 [μm], the control accuracy is 100±50 [μm].

The control accuracy of the floating height of the workpiece 30 in the shift region 61 is higher than the control accuracy of the floating height of the workpiece 30 in the substrate conveying region 60. For example, when the floating height of the workpiece 30 in the shift region 61 is set to be 50 to 150 [μm], the control accuracy is 100±50 [μm]. When the floating height of the workpiece 30 in the substrate conveying region 60 is set to be 300 to 500 [μm], the control accuracy is 400±100 [μm].

In addition, the control accuracy of the floating height of the workpiece 30 in the medium floating height region 52 is substantially equal to the control accuracy of the floating height of the workpiece 30 in the shift region 61. The floating height of the workpiece 30 in the medium floating height region 52 is set to be equal to the floating height of the workpiece 30 in the shift region 61.

Figure 15:
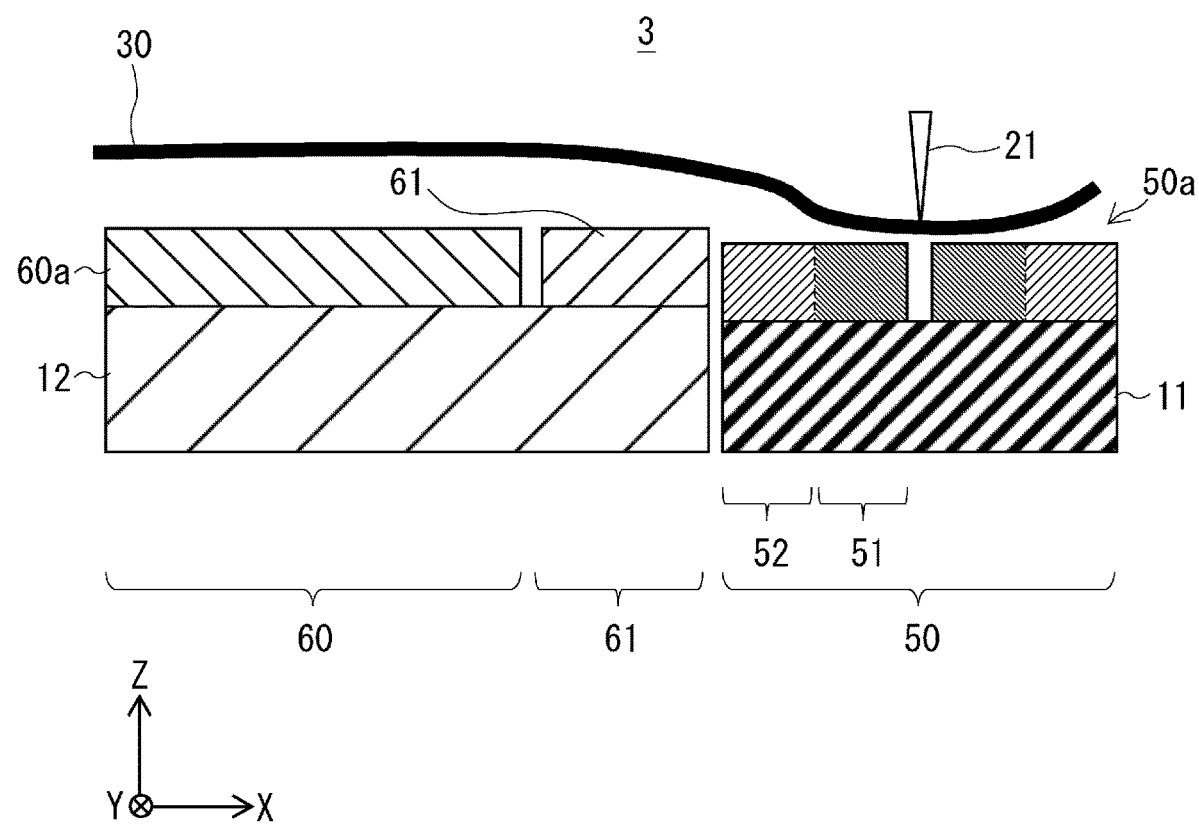
FIG. 15 is a cross-sectional view exemplifying the laser processing apparatus and a workpiece according to the third embodiment.

FIG. 15 is a cross-sectional view exemplifying the laser processing apparatus 3 and the workpiece 30 according to the third embodiment. As shown in FIG. 15, the shift region 61 and the medium floating height region 52 are provided to prevent a sudden change in the floating height of the workpiece 30 when the workpiece 30 moves from the substrate conveying region 60 to the low floating height region 51.

The floating height of the workpiece 30 in the shift region 61 is about 50 to 150 [μm], and the floating height of the workpiece 30 in the medium floating height region 52 is also 50 to 150 [μm]. Accordingly, the floating heights are equal at end portions where the metal surface plate 12 and the stone surface plate 11 are adjacent to each other. The floating height is significantly larger than the expected step D. For example, the floating height of the end portion is set to be 50 to 150 [μm] larger than the expected step D of 10 [μm].

Therefore, even when there is a minute step D between the shift region 61 over the metal surface plate 12 and the laser light irradiation region 50 over the stone surface plate 11, the workpiece 30 can be prevented from coming into contact with the member 61a, the member 60a, and the member 50a. Therefore, it is possible to prevent damage of the workpiece 30 and generation of dust due to the contact between the workpiece 30 and the conveying stage 40 and to improve the performance of the laser processing apparatus 3. Other configurations and effects are included in the description of Comparative Examples 1 and 2.

Fourth Embodiment

Figure 16:
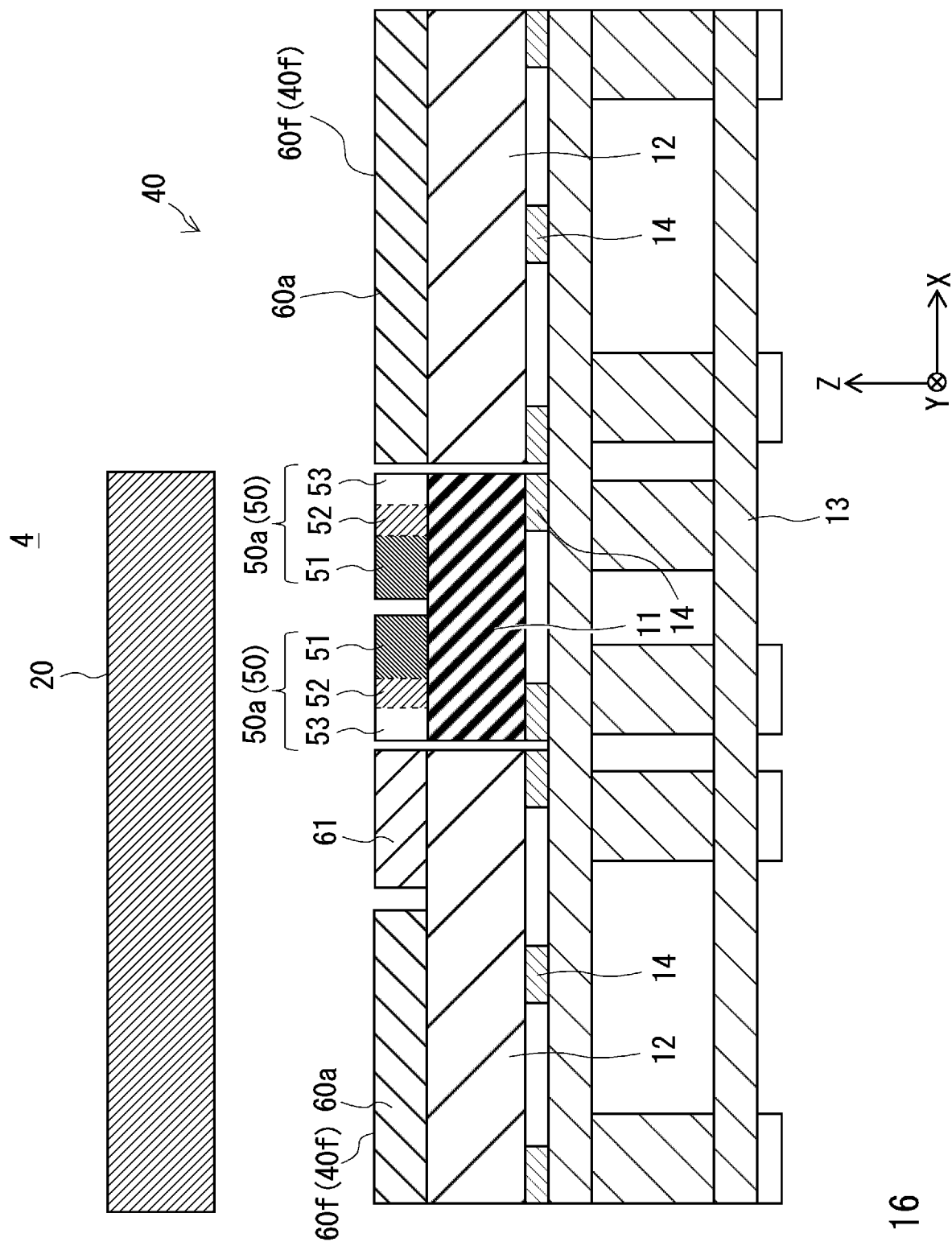
FIG. 16 is a cross-sectional view exemplifying a laser processing apparatus according to a fourth embodiment.
Figure 17:
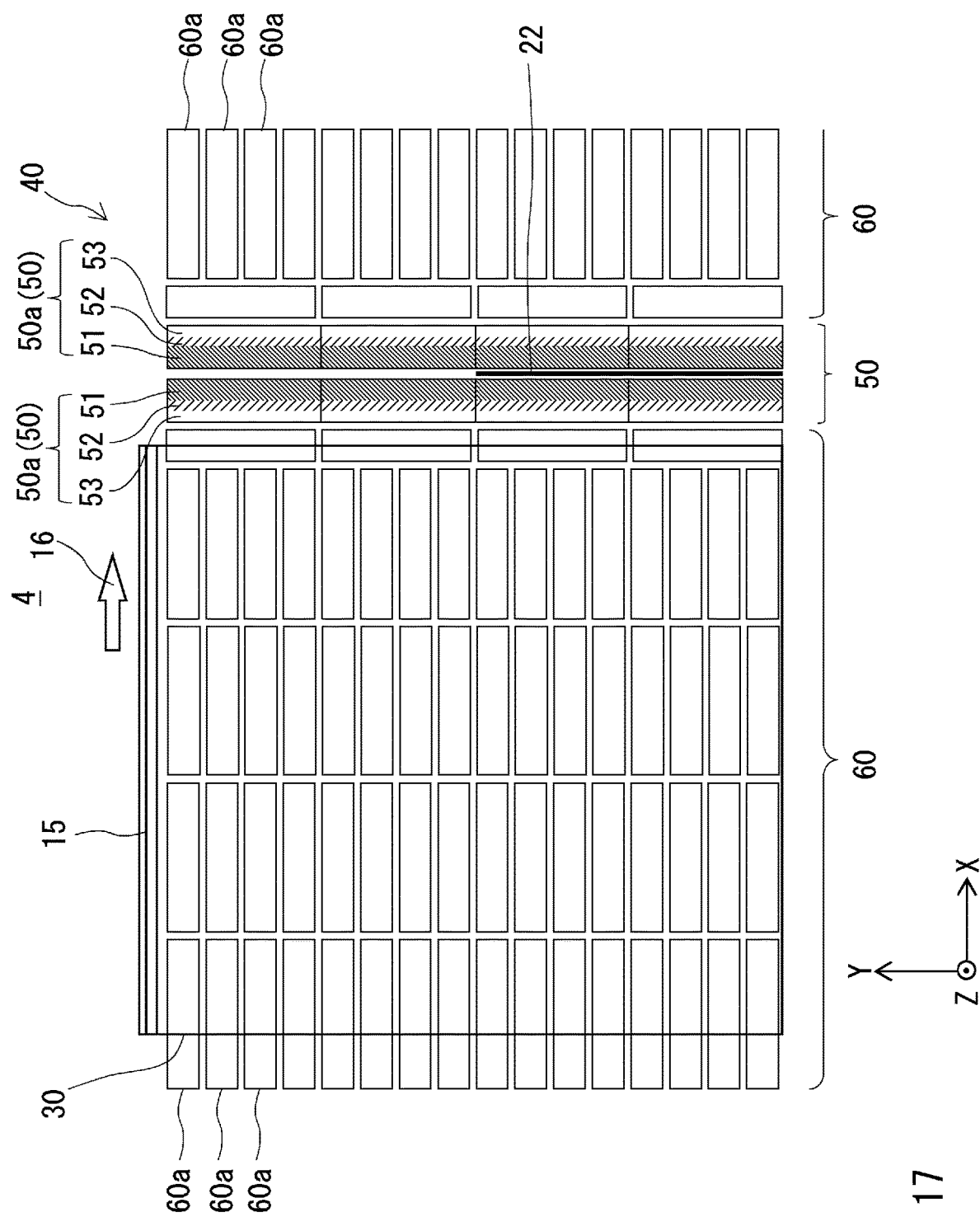
FIG. 17 is a plan view exemplifying a conveying stage of the laser processing apparatus according to the fourth embodiment.

A laser processing apparatus 4 according to a fourth embodiment will be described below. The laser processing apparatus 4 according to the fourth embodiment differs from the laser processing apparatus 3 according to the third embodiment in that a high floating height region 53 in addition to the low floating height region 51 and the medium floating height region 52 is provided over the stone surface plate 11. Further, the member 61a is not provided over the metal surface plate 12. FIG. 16 is a cross-sectional view exemplifying the laser processing apparatus 4 according to the fourth embodiment. FIG. 17 is a plan view exemplifying a conveying stage 40 of the laser processing apparatus 4 according to the fourth embodiment.

As shown in FIGS. 16 and 17, in the laser processing apparatus 4 according to the fourth embodiment, the member 50a over the stone surface plate 11 is divided into a low floating height region 51, a medium floating height region 52, and a high floating height region 53. In other words, the low floating height region 51, the medium floating height region 52, and the high floating height region 53 are regions in the member 50a. The high floating height region 53 is disposed in the member 50a so as to be closer to the substrate conveying region 60. Accordingly, the medium floating height region 52 is disposed between the high floating height region 53 and the low floating height region 51. The member 50a is divided into the low floating height region 51, the medium floating height region 52, and the high floating height region 53, but the member 50a is a single member.

In a plan view, the laser light irradiation region 50 includes the low floating height region 51, the medium floating height region 52 adjacent to the low floating height region 51, and the high floating height region 53 adjacent to the medium floating height region 52.

The low floating height region 51, the medium floating height region 52, and the high floating height region 53 are disposed side by side in the X-axis direction. The medium floating height region 52 is disposed between the low floating height region 51 and the high floating height region 53. The low floating height region 51 overlaps a focus 22 of the laser light 21 in a plan view. The member 50a includes the low floating height region 51, the medium floating height region 52, and the high floating height region 53 in a plan view.

The floating height of the workpiece 30 in the high floating height region 53 is larger than the floating height of the workpiece 30 in the medium floating height region 52. The floating height of the workpiece 30 in the medium floating height region 52 is larger than the floating height of the workpiece 30 in the low floating height region 51.

For example, the floating height of the workpiece 30 in the low floating height region 51 is set to be 10 to 30 [μm]. The floating height of the workpiece 30 in the medium floating height region 52 is set to be 50 to 150 [μm]. The floating height of the workpiece 30 in the high floating height region 53 is set to be 300 to 500 [μm].

Figure 18:
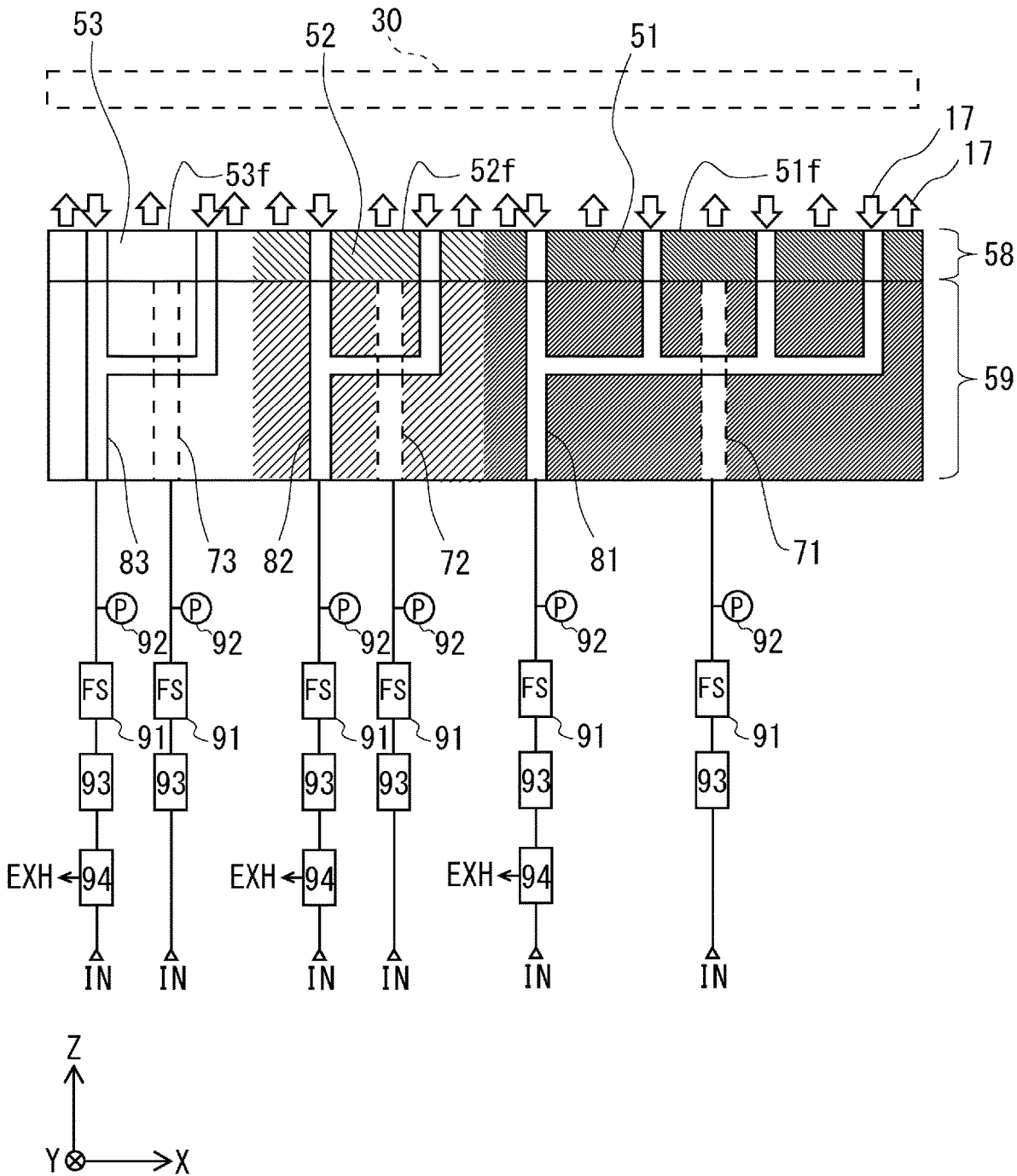
FIG. 18 is a cross-sectional view exemplifying a member forming a laser light irradiation region of the laser processing apparatus according to the fourth embodiment.
Figure 19:
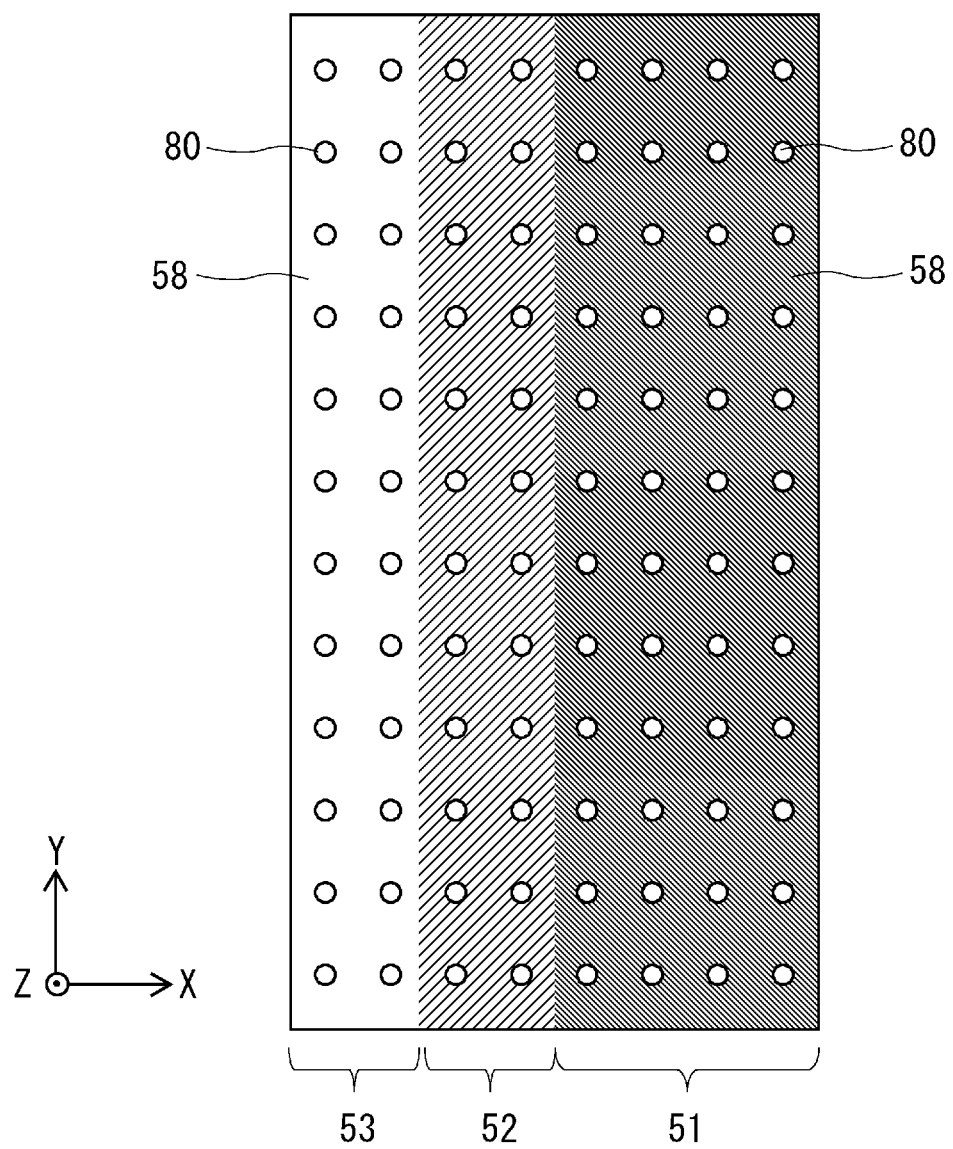
FIG. 19 is a plan view exemplifying the member forming the laser light irradiation region of the laser processing apparatus according to the fourth embodiment.

FIG. 18 is a cross-sectional view exemplifying the member 50a forming the laser light irradiation region 50 of the laser processing apparatus 4 according to the fourth embodiment. FIG. 19 is a plan view exemplifying the member 50a forming the laser light irradiation region 50 of the laser processing apparatus 4 according to the fourth embodiment. As shown in FIGS. 18 and 19, the low floating height region 51, the medium floating height region 52, and the high floating height region 53 in the member 50a can jet the predetermined gas 17 to float the workpiece 30. The low floating height region 51, the medium floating height region 52, and the high floating height region 53 include a porous body 58 and a pedestal 59. The porous body 58 is disposed over the pedestal 59.

An exhaust pipe 73 is connected in the high floating height region 53. In the low floating height region 51 and the medium floating height region 52, the exhaust pipe 71 and the exhaust pipe 72 are connected, respectively, as described above. Similarly to the exhaust pipe 71 and the exhaust pipe 72, the exhaust pipe 73 penetrates the pedestal 59 and is connected to the porous body 58. The predetermined gas 17 is supplied to the porous body 58 in the high floating height region 53 through the exhaust pipe 73. In the high floating height region 53, the predetermined gas 17 can jet out from the porous body 58. The predetermined gas 17 is discharged so as to effuse from minute pores in the porous body 58. The predetermined gas 17 jets out from the high floating height region 53 to the workpiece 30 through the porous body 58.

In this way the predetermined gas 17 is supplied to the member 50a through the exhaust pipe 71, the exhaust pipe 72, and the exhaust pipe 73. For example, the predetermined gas is supplied to the porous body 58 of the member 50a. Then, the predetermined gas 17 jets out from the member 50a to the workpiece 30.

The flow rates or the pressures of the predetermined gas 17 respectively passing through the exhaust pipe 71, the exhaust pipe 72, and the exhaust pipe 73 are independently controlled. For example, a flow meter 91, a pressure gauge 92, and a throttle valve 93 are connected to the respective exhaust pipes. The flow rate or the pressure of the predetermined gas 17 in the respective exhaust pipes can be adjusted by the throttle valve 93.

In addition, an intake pipe 83 is connected in the high floating height region 53. In the low floating height region 51 and the medium floating height region 52, the intake pipe 81 and the intake pipe 82 are connected respectively as described above. Similarly to the intake pipe 81 and the intake pipe 82, the intake pipe 83 penetrates the porous body 58 and the pedestal 59 in the high floating height region 53. The predetermined gas 17 jetting out between an upper surface 53f of the high floating height region 53 and the workpiece 30 can be sucked through the intake pipe 83. As described above, the predetermined gas is sucked into the member 50a through the intake pipe 81, the intake pipe 82, and the intake pipe 83.

The flow rates or the pressures of the predetermined gas 17 respectively passing through the intake pipe 81, the intake pipe 82, and the intake pipe 83 can be independently controlled. For example, a flow meter 91, a pressure gauge 92, and a throttle valve 93 are connected to the respective intake pipes. The flow rate or the pressure of the predetermined gas 17 in the respective intake pipes can be adjusted by the throttle valve 93. The flow rate or the pressure of the predetermined gas 17 in the respective intake pipes may be adjusted by a vacuum regulator 94.

In the present embodiment, the floating height of the workpiece 30 in the high floating height region 53 is set to be 300 to 500 [μm]. The floating height of the workpiece 30 in the medium floating height region 52 is set to be 50 to 150 [μm]. The floating height of the workpiece 30 in the low floating height region 51 is set to be 10 to 30 [μm]. Accordingly, the floating height of the substrate 31 in the high floating height region 53 is larger than that in the medium floating height region 52 and the low floating height region 51.

The control accuracy of the floating height of the workpiece 30 in the low floating height region 51 is higher than the control accuracy of the floating height of the workpiece 30 in the medium floating height region 52. For example, when the floating height of the workpiece 30 in the low floating height region 51 is set to be 10 to 30 [μm], the control accuracy is 20±10 [μm]. When the floating height of the workpiece 30 in the medium floating height region 52 is set to be 50 to 150 [μm], the control accuracy is 100±50 [μm].

In addition, the control accuracy of the floating height of the workpiece 30 in the medium floating height region 52 is higher than the control accuracy of the floating height of the workpiece 30 in the high floating height region 53. For example, the floating height of the workpiece 30 in the medium floating height region 52 is set to be 50 to 150 [μm], the control accuracy is 100±50 [μm]. When the floating height of the workpiece 30 in the high floating height region 53 is set to be 300 to 500 [μm], the control accuracy is 400±100 [μm].

The control accuracy of the floating height of the workpiece 30 in the high floating height region 53 is substantially equal to the control accuracy of the floating height of the workpiece 30 in the substrate conveying region 60. The floating height of the workpiece 30 in the high floating height region 53 is set to be equal to the floating height of the workpiece 30 in the substrate conveying region 60.

The high floating height region 53 and the medium floating height region 52 are provided to prevent a sudden change in the floating height of the workpiece 30 when the workpiece 30 moves from the substrate conveying region 60 to the low floating height region 51 in the laser light irradiation region 50.

The floating height of the workpiece 30 in the substrate conveying region 60 is about 300 to 500 [μm], and the floating height of the workpiece 30 in the high floating height region 53 is also 300 to 500 [μm]. Accordingly, the floating heights are equal at end portions where the metal surface plate 12 and the stone surface plate 11 are adjacent to each other. Further, not only the floating heights are equal, but also the floating height is set to be 300 to 500 [μm], which is higher than 50 to 150 [μm] in the third embodiment. Accordingly, the workpiece 30 can be prevented from coming into contact with the member 60a and the member 50a. Therefore, it is possible to prevent damage of the workpiece 30 and generation of dust due to the contact between the workpiece 30 and the conveying stage 40 and to improve the performance of the laser processing apparatus 4. Other configurations and effects are included in the description of the first to third embodiments.

Fifth Embodiment

Figure 20:
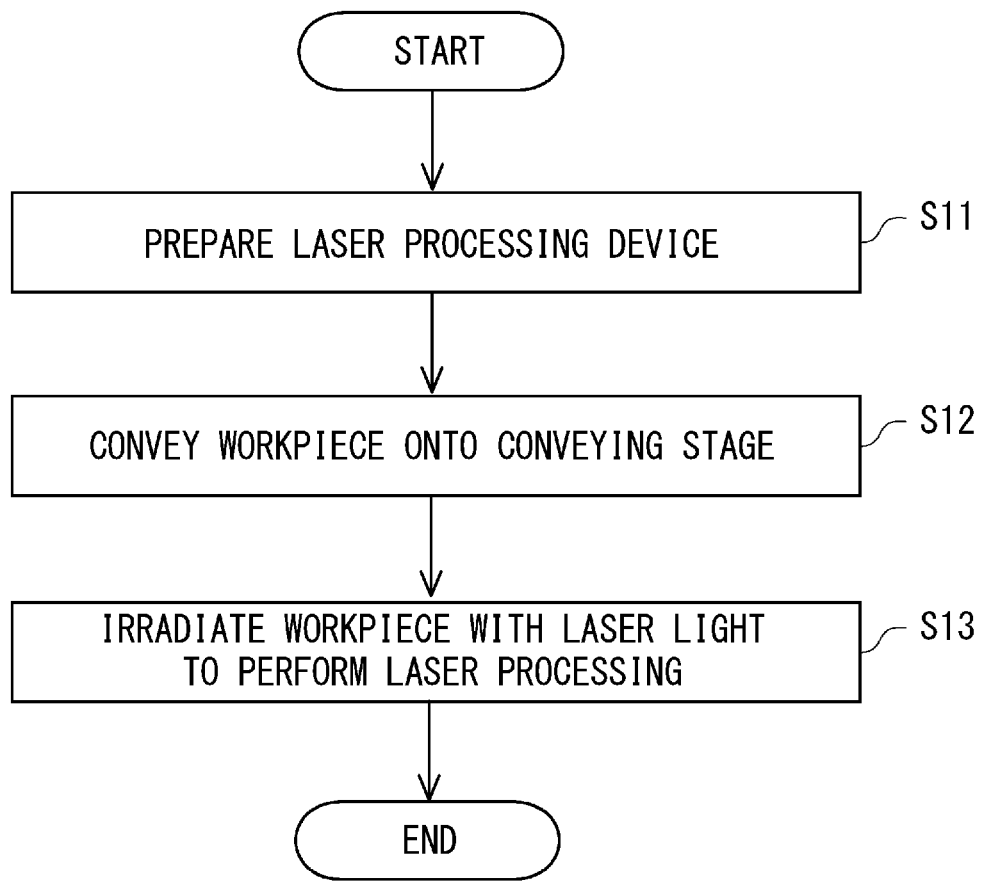
FIG. 20 is a flowchart exemplifying a laser processing method according to a fifth embodiment.

A fifth embodiment will be described below. The fifth embodiment relates to a laser processing method using a laser processing apparatus. FIG. 20 is a flowchart exemplifying the laser processing method according to the fifth embodiment. As shown in step S11 of FIG. 20, first, a laser processing apparatus is prepared. The laser processing apparatus to be prepared is preferably the laser processing apparatus according to any of the first to fourth embodiments.

Specifically, for example, a laser processing apparatus preferably includes a laser light irradiation unit 20 and a conveying stage 40 capable of allowing the workpiece 30 to float and conveying the workpiece 30. The conveying stage 40 preferably includes, in a plan view, a laser light irradiation region 50 in which the workpiece 30 is irradiated with laser light 21 irradiated from the laser light irradiation unit 20 and a substrate conveying region 60 separated from the laser light irradiation region 50. A surface of the laser light irradiation region 50 facing the workpiece 30 includes an upper surface 50f of a member 50a from which a predetermined gas 17 can jet out to float the workpiece 30, a surface of the substrate conveying region 60 facing the workpiece 30 includes upper surfaces 60f of a plurality of members 60a from which the predetermined gas 17 can jet out to float the workpiece 30, and the plurality of members 60a in the substrate conveying region 60 are disposed to be separated from each other.

Next, as shown in step S12 of FIG. 20, the workpiece 30 is conveyed onto the conveying stage 40 of the laser processing apparatus. Specifically, the workpiece 30 is conveyed from the substrate conveying region 60 toward the laser light irradiation region 50. In the substrate conveying region 60 and the laser light irradiation region 50, the floating height of the workpiece 30 is controlled to a predetermined floating height. In the cases of the second and third embodiments, the floating height of the workpiece 30 is also controlled to a predetermined floating height in the shift region 61.

Next, as shown in step S13 of FIG. 20, the workpiece 30 is irradiated with the laser light 21 to perform the laser processing. For example, when the workpiece 30 includes a substrate 31 and a semiconductor film 32 formed over the substrate 31, the semiconductor film 32 is irradiated with the laser light 21 to perform the laser processing. In this way, the workpiece 30 is subjected to the laser processing.

According to the laser processing method of the present embodiment, since the laser processing apparatus according to any of the first to fourth embodiments is used, it is possible to prevent the workpiece 30 from being deformed into a dome shape. Accordingly, it is possible to prevent the edge portions 39 and the corner portions of the workpiece 30 from coming into contact with the conveying stage 40 and being damaged and to prevent uneven irradiation with the laser light 21 due to dust generated from the damaged portions. Thus, it is possible to prevent the performance of the laser processing from being reduced.

Using the laser processing apparatuses according to the third and fourth embodiments, the floating height of the workpiece 30 can be made equal at the end portions where the metal surface plate 12 and the stone surface plate 11 are adjacent to each other. Therefore, it is possible to prevent the workpiece 30 from coming into contact with the member 60a and the member 50a. Thus, it is possible to prevent the damage of the workpiece 30 and the generation of dust due to the contact between the workpiece 30 and the conveying stage 40 and to improve the performance of the laser processing apparatuses 1 to 4.

Method of Manufacturing Semiconductor Device

Next, as another embodiment, a method of manufacturing a semiconductor device using the laser irradiation apparatus described above will be described. The method of manufacturing the semiconductor device according to the present embodiment includes a step of preparing a laser processing apparatus, a step of conveying a substrate 31 on which an amorphous semiconductor film 32 is formed, as a workpiece 30, onto a conveying stage 40, and a step of irradiating the workpiece 30 with laser light to polycrystallize the amorphous semiconductor film 32. In the step of polycrystallizing the amorphous semiconductor film 32, a laser processing method using a laser processing apparatus is performed. The semiconductor device includes, for example, a thin film transistor (TFT). The polycrystallized semiconductor film 32 constitutes at least a part of the thin film transistor. The thin film transistor is used for controlling a display, for example.

Figure 21:
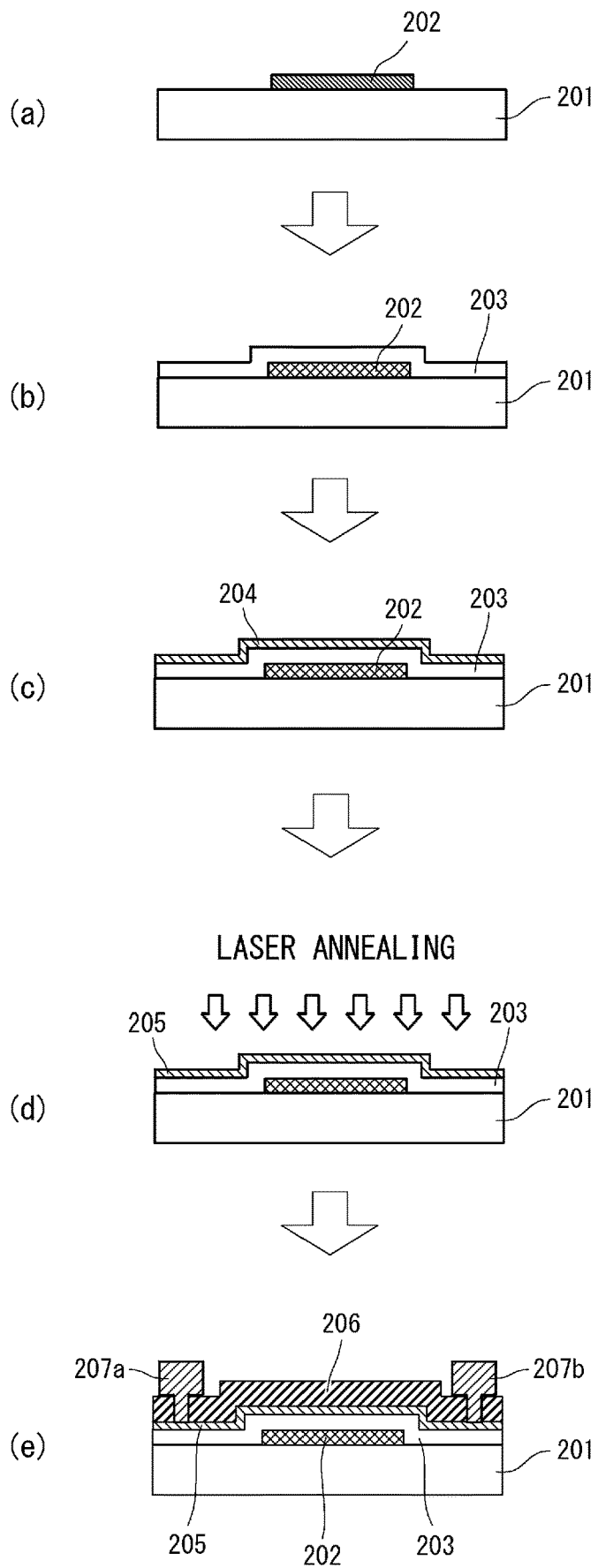
FIG. 21 is a cross-sectional view for explaining an example of a method of manufacturing a semiconductor device.

FIG. 21 is a cross-sectional view for explaining an example of the method of manufacturing the semiconductor device. The laser processing apparatuses according to the above-described first to fourth embodiments are suitable for manufacturing a TFT array substrate. In the drawings, a part of hatching is not presented so as not to be complicated. A method of manufacturing a semiconductor device including a TFT will be described below.

First, as shown in FIG. 21(a), a gate electrode 202 is formed over a glass substrate 201. For example, a metal thin film containing aluminum or the like can be used for the gate electrode 202. Next, as shown in FIG. 21(b), a gate insulating film 203 is formed over the gate electrode 202. The gate insulating film 203 is formed so as to cover the gate electrode 202. After that, as shown in FIG. 21(c), an amorphous silicon film 204 is formed over the gate insulating film 203. The amorphous silicon film 204 is disposed so as to overlap the gate electrode 202 with the gate insulating film 203 interposed therebetween.

The gate insulating film 203 is, for example, a silicon nitride film ($SiN_x$), a silicon oxide film ($SiO_2$ film), or a laminated film thereof. Specifically, the gate insulating film 203 and the amorphous silicon film 204 are successively formed by a CVD (Chemical Vapor Deposition) method. The glass substrate 201 with the amorphous silicon film 204 becomes the workpiece 30 in the laser processing apparatus 1.

Then, as shown in FIG. 21(d), the amorphous silicon film 204 is irradiated with laser light using the laser processing apparatus described above to crystallize the amorphous silicon film 204, and thus a polysilicon film 205 is formed. As a result, the polysilicon film 205 in which silicon is crystallized is formed over the gate insulating film 203.

At this time, the use of the laser processing apparatuses according to the embodiments described above can reduce the influence of flexure of the glass substrate 201 during laser irradiation and can prevent deviation from the depth of focus (DOF) of the laser light with which the amorphous silicon film 204 is irradiated. Therefore, the uniformly crystallized polysilicon film 205 can be formed.

Subsequently, as shown in FIG. 21(e), an interlayer insulating film 206, a source electrode 207a, and a drain electrode 207b are formed over the polysilicon film 205. The interlayer insulating film 206, the source electrode 207a, and the drain electrode 207b can be formed by a general photolithography method or a general film forming method.

By using the method of manufacturing the semiconductor device described above, the semiconductor device including TFTs can be manufactured. Note that the subsequent manufacturing steps will vary depending on the device to be finally manufactured, and therefore will not be described.

Organic Electroluminescence Display

Figure 22:
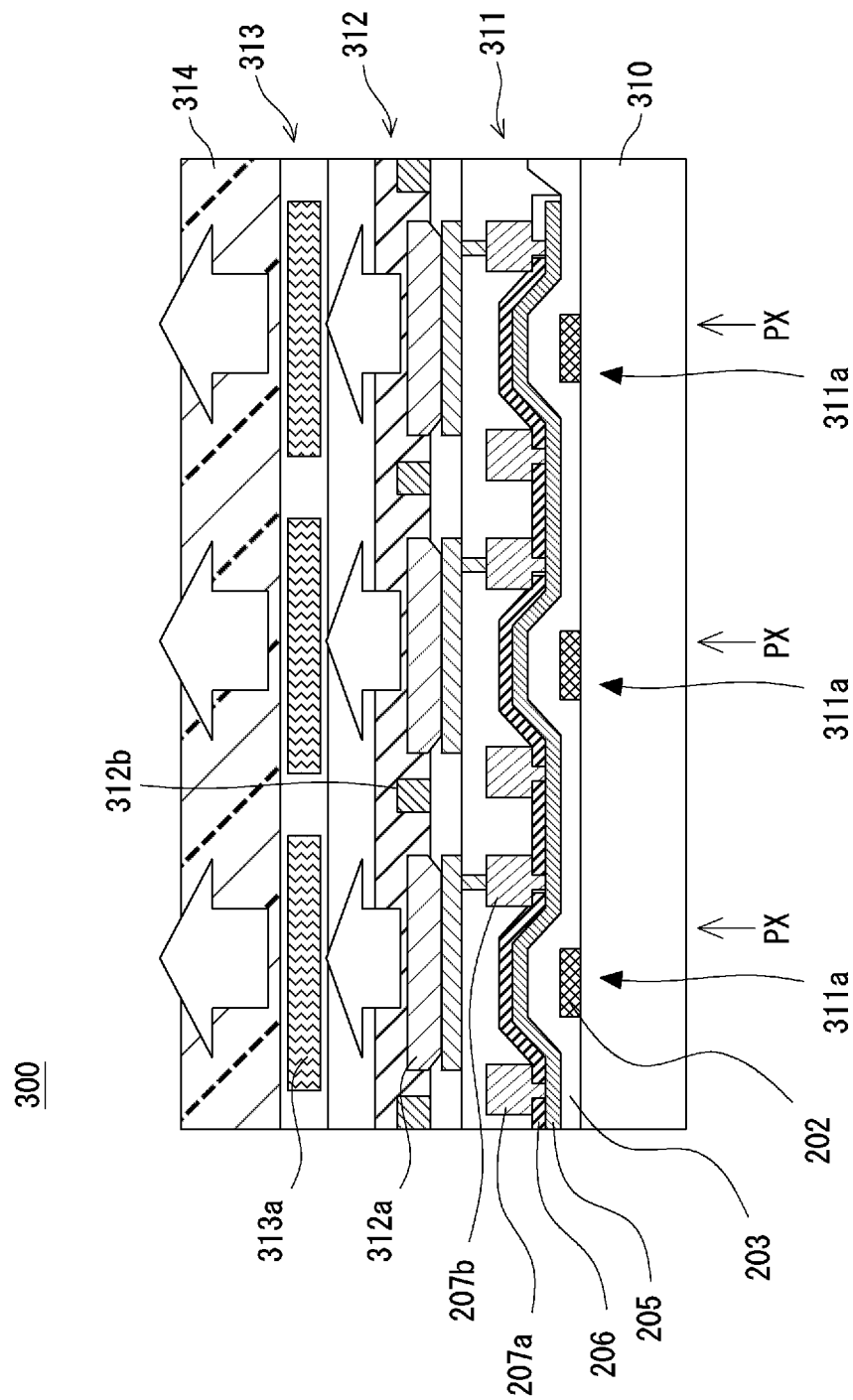
FIG. 22 is a cross-sectional view for explaining an outline of an organic electroluminescence display, and shows a simplified pixel circuit of the organic electroluminescence display.

Next, as an example of the device using the semiconductor device including TFTs, an organic electroluminescence display will be described. FIG. 22 is a cross-sectional view for explaining an outline of an organic electroluminescence display device, and shows a simplified pixel circuit of the organic electroluminescence display. An organic electroluminescence display device 300 shown in FIG. 22 is an active-matrix-type display device in which a TFT is disposed in each pixel Px.

The organic electroluminescence display device 300 includes a substrate 310, a TFT layer 311, an organic layer 312, a color filter layer 313, and a sealing substrate 314. FIG. 22 shows a top-emission-type organic electroluminescence display in which the side of the sealing substrate 314 is located on the viewing side. Note that the following description is given to show an example of a configuration of an organic electroluminescence display and the present embodiment is not limited to the configuration described below. For example, the semiconductor device according to the present embodiment may be used in a bottom-emission-type organic electroluminescence display.

The substrate 310 is a glass substrate or a metal substrate. The TFT layer 311 is provided over the substrate 310. The TFT layer 311 includes TFTs 311a disposed in the respective pixels Px. Further, the TFT layer 311 includes wirings connected to the TFTs 311a. The TFTs 311a and the wirings constitute a pixel circuit. Note that the TFT layer 311 corresponds to the TFT described in FIG. 19, and includes a gate electrode 202, a gate insulating film 203, a polysilicon film 205, an interlayer insulating film 206, a source electrode 207a, and a drain electrode 207b.

The organic layer 312 is provided over the TFT layer 311. The organic layer 312 includes an organic electroluminescence light-emitting element 312a disposed in each pixel Px. The organic electroluminescence light-emitting element 312a has, for example, a laminated structure in which an anode, a hole injection layer, a hole transport layer, a light-emitting layer, an electron transport layer, an electron injection layer, and a cathode are laminated. In the case of the top emission type, the anode is a metal electrode and the cathode is a transparent conductive film made of ITO (Indium Tin Oxide) or the like. Further, the organic layer 312 is provided with a partition wall 312b for separating organic electroluminescence light-emitting elements 312a between the pixels Px.

The color filter layer 313 is provided over the organic layer 312. The color filter layer 313 includes color filters 313a for performing color display. In other words, a resin layer colored in R (red), G (green), or B (blue) is provided as the color filter 313a in each pixel Px. When white light emitted from the organic layer 312 passes through the color filters 313a, the white light is converted into light having RGB colors. Note that in the case of a three-color system in which organic electroluminescence light-emitting elements capable of emitting each color of RGB are provided in the organic layer 312, the color filter layer 313 may be unnecessary.

The sealing substrate 314 is provided over the color filter layer 313. The sealing substrate 314 is a transparent substrate such as a glass substrate and is provided to prevent deterioration of the organic electroluminescence light-emitting elements of the organic layer 312.

A current flowing through the organic electroluminescence light-emitting elements 312a of the organic layer 312 is changed according to display signals supplied to the pixel circuit. Therefore, it is possible to control an amount of light emitted in each pixel Px by supplying a display signal corresponding to a display image to each pixel Px. As a result, a desired image can be displayed.

Although the organic electroluminescence display device has been described above as an example of a device using a semiconductor device including TFTs, the semiconductor device including TFTs may be, for example, a liquid crystal display. Further, the case where the laser processing apparatus 1 according to the present embodiment is applied to the laser annealing apparatus has been described. However, the laser processing apparatus 1 according to the present embodiment can also be applied to apparatuses other than the laser annealing apparatus.

Although the present invention made by the inventors has been specifically described above based on embodiments, the present invention is not limited to the above-described embodiments, and various modifications can be made without departing from the scope of the present invention.

This application is based upon and claims the benefit of priority from Japanese patent application No. 2018-080321, filed on Apr. 19, 2018, the entire contents of which are incorporated herein by reference.

REFERENCE SIGNS LIST 1, 2, 3, 4, 101 laser processing apparatus
11 stone surface plate
12 metal surface plate
13 trestle 14 height adjustment mechanism
15 gripping mechanism
16 conveying direction
17 predetermined gas
20 laser light irradiation unit
21 laser light
22 focus
30 workpiece
31 substrate
32 semiconductor film
39 edge portion
40 conveying stage
40f upper surface
50 laser light irradiation region
50a member
50f upper surface
51 low floating height region
52 medium floating height region
53 high floating height region
58 porous body
59 pedestal
60 substrate conveying region
60a member
60f upper surface
61 shift region
61a member
70, 71, 72, 73 exhaust pipe
80, 81, 82, 83 intake pipe
90 through hole

The invention claimed is:

1. A laser processing apparatus comprising:
a laser light irradiation unit; and
a conveying stage capable of allowing a substrate to float and convey, wherein
the conveying stage includes:
  a laser light irradiation region in which the substrate is irradiated with laser light irradiated from the laser light irradiation unit; and
  a substrate conveying region separated from the laser light irradiation region,
a surface of the laser light irradiation region facing the substrate is configured by a first member from which a first gas is capable of jetting out to float the substrate,
a surface of the substrate conveying region facing the substrate is configured by a plurality of second members from which a second gas is capable of jetting out to float the substrate, and
the plurality of second members in the substrate conveying region are disposed to be separated from each other,
the first member includes:
  a first region;
  a second region adjacent to the first region; and
  a third region adjacent to the second region,
the third region overlaps a focus of the laser light in a plan view,
the second region is between the first region and the third region,
the first and second regions do not overlap the focus of the laser light in the plan view,
control accuracy of a floating height of the substrate in the second region is higher than control accuracy of a floating height of the substrate in the first region, and
control accuracy of a floating height of the substrate in the third region is higher than the control accuracy of the floating height of the substrate in the second region.

2. The laser processing apparatus according to claim 1, wherein
the first member is connected to a first exhaust pipe in the first region, a second exhaust pipe in the second region, and a third exhaust pipe in the third region,
the first gas is supplied to the first member through the first exhaust pipe, the second exhaust pipe, and the third exhaust pipe,
the first gas jets out from the first member to the substrate, and
flow rates or pressures of the first gas respectively passing through the first exhaust pipe, the second exhaust pipe, and the third exhaust pipe are independently controllable.

3. The laser processing appartus according to claim 1, wherein
the first member is connected to a first intake pipe in the first region, a second intake pipe in the second region, and a third intake pipe in the third region,
the first gas is sucked through the first intake pipe, the second intake pipe, and the third intake pipe, and
flow rates or pressures of the first gas respectively passing through the first pipe, the second pipe, and the third pipe are independently controllable.

4. The laser processing apparatus according to claim 1, wherein
a floating height of the substrate from a surface of the first member in the first region is larger than a floating height of the substrate from a surface of the first member in the second region, and
a floating height of the substrate from the surface of the first member in the second region is larger than a floating height of the substrate from a surface of the first member in the third region.

5. The laser processing apparatus according to claim 1, wherein
the first member is a porous body, and
the first gas is capable of jetting out from the porous body.

6. The laser processing apparatus according to claim 1, wherein the first member is ceramics.

7. The laser processing apparatus according to claim 1, wherein each of the plurality of second members includes a plurality of through holes through which the second gas is capable of jetting out.

8. The laser processing apparatus according to claim 1, wherein the plurality of second members are made of a metal.

9. The laser processing apparatus according to claim 8, wherein the plurality of second members have aluminum as a main component.

10. The laser processing apparatus according to claim 1, wherein the substrate is a glass substrate.

11. The laser processing apparatus according to claim 1, wherein
an amorphous semiconductor film is formed over the substrate, and
the amorphous semiconductor film is transformed into a polycrystalline semiconductor film by irradiation with the laser light.

12. The laser processing apparatus according to claim 11, wherein the polycrystalline semiconductor film constitutes a thin film transistor.

13. The laser processing apparatus according to claim 12, wherein the thin film transistor is used for control of a display.

14. A laser processing apparatus comprising:
a laser light irradiation unit; and
a conveying stage capable of allowing a substrate to float and convey, wherein
the conveying stage includes:
- a laser light irradiation region in which the substrate is irradiated with laser light irradiated from the laser light irradiation unit; and
- a substrate conveying region separated from the laser light irradiation region, a surface of the laser light irradiation region facing the substrate is configured by a first member from which a first gas is capable of jetting out to float the substrate,
the first member includes:
- a first region;
- a second region adjacent to the first region; and
- a third region adjacent to the second region, the third region overlaps a focus of the laser light in a plan view,
the second region is between the first region and the third region,
the first and second regions do not overlap the focus of the laser light in the plan view,
control accuracy of a floating height of the substrate in the second region is higher than control accuracy of a floating height of the substrate in the first region, and
control accuracy of a floating height of the substrate in the third region is higher than the control accuracy of the floating height of the substrate in the second region, wherein
- a floating height of the substrate from a surface of the first member in the first region is larger than a floating height of the substrate from a surface of the first member in the second region, and
- a floating height of the substrate from the surface of the first member in the second region is larger than a floating height of the substrate from a surface of the first member in the third region.

15. The laser processing apparatus according to claim 14, wherein
the first member is connected to a first exhaust pipe in the first region, a second exhaust pipe in the second region, and a third exhaust pipe in the third region,
the first gas is supplied to the first member through the first exhaust pipe, the second exhaust pipe, and the third exhaust pipe,
the first gas jets out from the first member to the substrate, and
flow rates or pressures of the first gas respectively passing through the first exhaust pipe, the second exhaust pipe, and the third exhaust pipe are independently controllable.

16. The laser processing apparatus according to claim 14, wherein
the first member is connected to a first intake pipe in the first region, a second intake pipe in the second region, and a third intake pipe in the third region,
the first gas is sucked through the first intake pipe, the second intake pipe, and the third intake pipe, and
flow rates or pressures of the first gas respectively passing through the first pipe, the second pipe, and the third pipe are independently controllable.

17. The laser processing apparatus according to claim 14, wherein
the first member is a porous body, and
the first gas is capable of jetting out from the porous body.

18. The laser processing apparatus according to claim 14, wherein the first member is ceramics.

* * * * *